US011342536B2

(12) United States Patent
Lee et al.

(10) Patent No.: US 11,342,536 B2
(45) Date of Patent: May 24, 2022

(54) DISPLAY DEVICE HAVING PERIPHERAL AREA PROTRUSIONS

(71) Applicant: Samsung Display Co., LTD., Yongin-si (KR)

(72) Inventors: Jin Hyeong Lee, Hwaseong-si (KR); Su Jeong Kim, Yongin-si (KR); Jong Ho Son, Seoul (KR); Mi Hwa Lee, Seoul (KR); Yun Ho Lee, Cheonan-si (KR)

(73) Assignee: Samsung Display Co., LTD., Yongin-si (KR)

( * ) Notice: Subject to any disclaimer, the term of this patent is extended or adjusted under 35 U.S.C. 154(b) by 53 days.

(21) Appl. No.: 16/744,030

(22) Filed: Jan. 15, 2020

(65) Prior Publication Data

US 2020/0395574 A1  Dec. 17, 2020

(30) Foreign Application Priority Data

Jun. 14, 2019 (KR) .................. 10-2019-0070801

(51) Int. Cl.
| | |
|---|---|
| H01L 51/52 | (2006.01) |
| H01L 27/32 | (2006.01) |
| H01L 27/14 | (2006.01) |
| H01L 33/44 | (2010.01) |
| G02F 1/13 | (2006.01) |

(Continued)

(52) U.S. Cl.
CPC ........ *H01L 51/5253* (2013.01); *H01L 27/322* (2013.01); *H01L 51/56* (2013.01); *G02F 1/133512* (2013.01); *G02F 1/133514* (2013.01); *G02F 1/136209* (2013.01);

(Continued)

(58) Field of Classification Search
CPC .............. H01L 51/5253; H01L 27/322; H01L 27/14678; H01L 27/323; H01L 27/3244; H01L 33/44; G02F 1/133514; G02F 1/136209; G02F 1/133512; G02F 2001/133519; G02F 2001/136222
See application file for complete search history.

(56) References Cited

U.S. PATENT DOCUMENTS 7,884,900 B2 * 2/2011 Doi ..................... G02F 1/1339
349/110
9,971,075 B2  5/2018 Jiang et al.
(Continued)

FOREIGN PATENT DOCUMENTS

| KR | 10-2014-0140209 | 12/2014 |
|---|---|---|
| KR | 10-2018-0074980 | 7/2018 |
| KR | 10-1929452 | 12/2018 |

*Primary Examiner* — Ida M Soward
(74) *Attorney, Agent, or Firm* — H.C. Park & Associates, PLC

(57) ABSTRACT

A display device includes: a display layer having a display area including a plurality of pixel areas and a peripheral area at least partially surrounding the display area; and a cover layer disposed on the display layer to encapsulate the display area. The cover layer includes: a light blocking portion overlapping the display area and the peripheral area and including a plurality of openings to transmit light from the plurality of pixel areas and to block light in the peripheral area; a first protrusion disposed on the light blocking portion in the peripheral area and surrounding the display area; and an overcoating layer covering the display area and contacting a lateral surface of the first protrusion.

14 Claims, 21 Drawing Sheets

(51) Int. Cl.
  *H01L 51/56* (2006.01)
  *G02F 1/1335* (2006.01)
  *H01L 27/146* (2006.01)
  *G02F 1/1362* (2006.01)

(52) U.S. Cl.
  CPC ...... *H01L 27/14678* (2013.01); *H01L 27/323* (2013.01); *H01L 27/3244* (2013.01); *H01L 33/44* (2013.01)

(56) References Cited

U.S. PATENT DOCUMENTS

| | | | | |
|---|---|---|---|---|
| 10,162,237 | B2 * | 12/2018 | Han | H01L 29/78633 |
| 10,224,383 | B2 * | 3/2019 | Park | H01L 27/3246 |
| 10,304,921 | B2 * | 5/2019 | Lee | H01L 27/3262 |
| 10,347,853 | B2 | 7/2019 | Park et al. | |
| 10,409,411 | B2 | 9/2019 | Heo et al. | |
| 10,516,134 | B2 * | 12/2019 | Ochi | H01L 27/1248 |
| 10,566,394 | B2 * | 2/2020 | Cai | H01L 51/5253 |
| 10,608,199 | B2 * | 3/2020 | Kim | G09G 3/3291 |
| 10,784,318 | B2 * | 9/2020 | Gwon | H01L 51/5256 |
| 10,825,873 | B2 * | 11/2020 | Oh | G06F 3/0412 |
| 10,978,522 | B2 * | 4/2021 | Gwon | G06F 3/0445 |
| 10,978,546 | B2 * | 4/2021 | Park | H01L 51/5281 |
| 11,005,072 | B2 * | 5/2021 | Shin | H01L 27/3246 |
| 11,094,773 | B2 * | 8/2021 | Lee | H01L 27/3279 |
| 2016/0204373 | A1 * | 7/2016 | Park | H01L 27/3246 257/40 |
| 2018/0069195 | A1 * | 3/2018 | Furuie | H01L 27/3272 |
| 2018/0356689 | A1 | 12/2018 | Kim et al. | |
| 2019/0165312 | A1 * | 5/2019 | Bae | G09G 3/20 |
| 2020/0035946 | A1 * | 1/2020 | Cheng | H01L 27/3244 |
| 2020/0067010 | A1 * | 2/2020 | Lee | H01L 51/5253 |
| 2021/0193744 | A1 * | 6/2021 | Gwon | H01L 27/3246 |
| 2021/0193787 | A1 * | 6/2021 | Won | H01L 27/323 |

* cited by examiner

DISPLAY DEVICE HAVING PERIPHERAL AREA PROTRUSIONS

CROSS-REFERENCE TO RELATED APPLICATION

This application claims priority from and the benefit of Korean Patent Application No. 10-2019-0070801, filed on Jun. 14, 2019, which is hereby incorporated by reference for all purposes as if fully set forth herein.

BACKGROUND

Field

Exemplary implementations of the invention generally relate to a display device and a method for manufacturing the same and, more specifically, to a display device including an encapsulating layer and a method for manufacturing the same without the use of a photomask process that can damage the light emitting elements, such as organic light emitting diodes.

Discussion of the Background

An organic light emitting diode display device includes two electrodes and a light emitting layer disposed therebetween, and an electron injected from one electrode and a hole injected from the other electrode are coupled with each other in the light emitting layer to generate excitons. The generated excitons are changed to a ground state from an excited state, releasing energy to emit light.

The organic light emitting diode display device includes a plurality of pixels each including an organic light emitting diode as a self-emissive element, and a plurality of transistors and at least one capacitor for driving the organic light emitting diode are formed in each pixel. The plurality of transistors basically include a switching transistor and a driving transistor. The organic light emitting diode display device may resonate and emit the generated light, and a contrast of the generated light may be decreased by reflection of external light in a plurality of transistors, capacitors, and signal lines connected thereto.

In order to improve the contrast, a polarizing film may be bonded to the organic light emitting diode display device. The polarizing film includes a linear polarizing film and a retardation film. Since the thickness of the polarizing film is as thick as about 200 μm, it is difficult to make the organic light emitting diode display device thin and the production cost thereof increases.

The above information disclosed in this Background section is only for enhancement of understanding of the background of the invention, and therefore it may contain information that does not form the prior art that is already known in this country to a person of ordinary skill in the art.

SUMMARY

Applicant discovered that characteristics of organic light emitting diodes in display devices may be changed by short wavelength light generated in during the process of making an encapsulating layer from an overcoating material, so that quality of the organic light emitting diode display device may be degraded. In addition, the overcoating material may be wasted by forming the overcoating layer in an area other than a display area of the organic light emitting diode display device.

Display devices constructed according to the principles and exemplary implementations of the invention and methods of manufacturing display devices same are capable of improving contrast in the display device without using a polarizing firm, which also may reduce manufacturing cost and process. In addition, the manufacturing methods of the invention may reduce waste of an overcoating material used in forming an encapsulating layer of an organic light emitting diode display device, and shorten the manufacturing processes by, e.g., excluding exposure and development processes from the processes of forming the encapsulating layer.

Display devices constructed according to the principles and exemplary embodiments of the invention and methods of manufacturing same can prevent or at least reduce the electrical characteristics of a light emitting diode from being changed.

Additional features of the inventive concepts will be set forth in the description which follows, and in part will be apparent from the description, or may be learned by practice of the inventive concepts.

According to one aspect of the invention, a display device includes: a display layer having a display area including a plurality of pixel areas and a peripheral area at least partially surrounding the display area; and a cover layer disposed on the display layer to encapsulate the display area, wherein the cover layer includes: a light blocking portion overlapping the display area and the peripheral area and including a plurality of openings to transmit light from the plurality of pixel areas and to block light in the peripheral area; a first protrusion disposed on the light blocking portion in the peripheral area and surrounding the display area; and an overcoating layer covering the display area and contacting a lateral surface of the first protrusion.

The cover layer may further include a plurality of color filters disposed on the light blocking portion and overlapping the plurality of openings.

The plurality of color filters may include a first color filter of a first color, a second color filter of a second color, and a third color filter of a third color, and the first color filter, the second color filter, and the third color filter may overlap different openings.

The first protrusion may include a first dam including a first layer made of the same material as the first color filter.

The display device may further include: a second dam disposed on the light blocking portion in the peripheral area and disposed between the first dam and the display area to surround the display area, wherein the second dam includes a second layer including the same material as one of the first to third color filters.

The first dam may further include a second layer disposed on the first layer, and the second layer includes the same material as the second color filter.

The second layer may have a width substantially equal to or smaller than that of the first layer.

The display device may further include: a second dam disposed on the light blocking portion in the peripheral area and disposed between the first dam and the display area to surround the display area, wherein the second dam includes one layer or two layers, in which the one layer includes the same material as one of the first to third color filters, and the two layers include the same materials as two of the first to third colors.

The first dam may further include a third layer disposed on the second layer, and the third layer may include the same material as the third color filter.

The third layer may have a width substantially equal to or smaller than that of the second layer.

The display device may further include: a second dam disposed on the light blocking portion in the peripheral area and disposed between the first dam and the display area to surround the display area, wherein the second dam includes one layer, two layers, or three layers, and wherein the one layer includes the same material as one of the first to third color filters, the two layers include the same materials as two of the first to third color filters, and the three layers include the same materials as the first to third color filters.

The first layer may have a thickness substantially the same as that of the first color filter; the second layer may have a thickness substantially the same as that of the second color filter; and the third layer may have a thickness substantially the same as that of the third color filter.

The overcoating layer may include an ultraviolet wavelength blocking agent.

The display device may further include: a touch sensor layer disposed between the display layer and the cover layer.

According to another aspect of the invention, a method of manufacturing a display device includes the steps of: forming a first layer including a plurality of light emitting diodes; forming a second layer including a plurality of touch electrodes on the first layer; forming a light blocking portion that includes a plurality of openings overlapping the plurality of light emitting diodes, on the second layer; forming a plurality of color filters in the plurality of openings; forming a first protrusion with the same material as at least one of the plurality of color filters in a peripheral area at least partially surrounding the plurality of light emitting diodes simultaneously with forming the plurality of color filters in the plurality of openings; and forming a third layer covering the plurality of light emitting diodes.

The step of forming the third layer may include: coating an overcoating material in an area surrounded by the first protrusion and then baking the overcoating material without exposure to short wavelength light.

The overcoating material may include an ultraviolet wavelength blocking agent.

The step of forming a first protrusion may include forming a first protrusion layer with the same material as a first one of the plurality of color filters.

The step of forming a first protrusion may further include forming another layer on the first protrusion layer with the same material as a second one of the plurality of color filters.

The method may further include a step of: forming a second protrusion between the first protrusion and a display area in which the plurality of light emitting diodes are disposed with the same material as at least one of the plurality of color filters when forming the plurality of color filters in the plurality of openings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
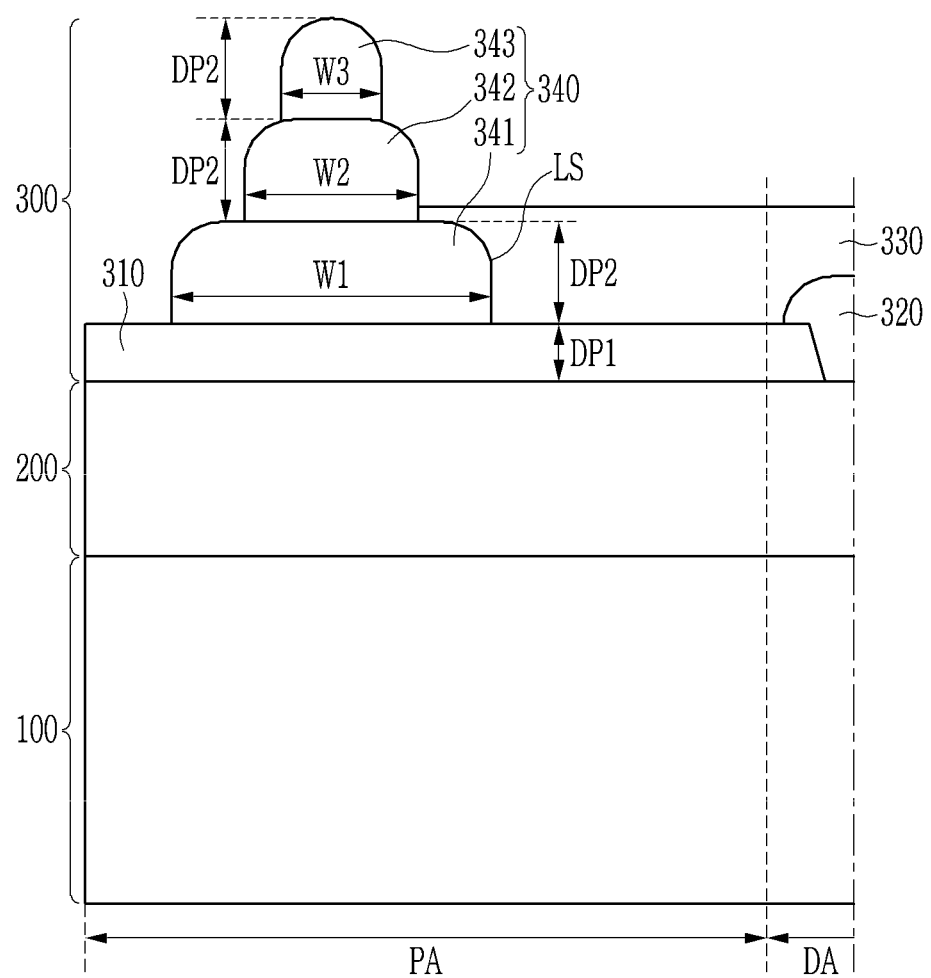
FIG. 1 is a cross-sectional view of portions of a peripheral area and a display area of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
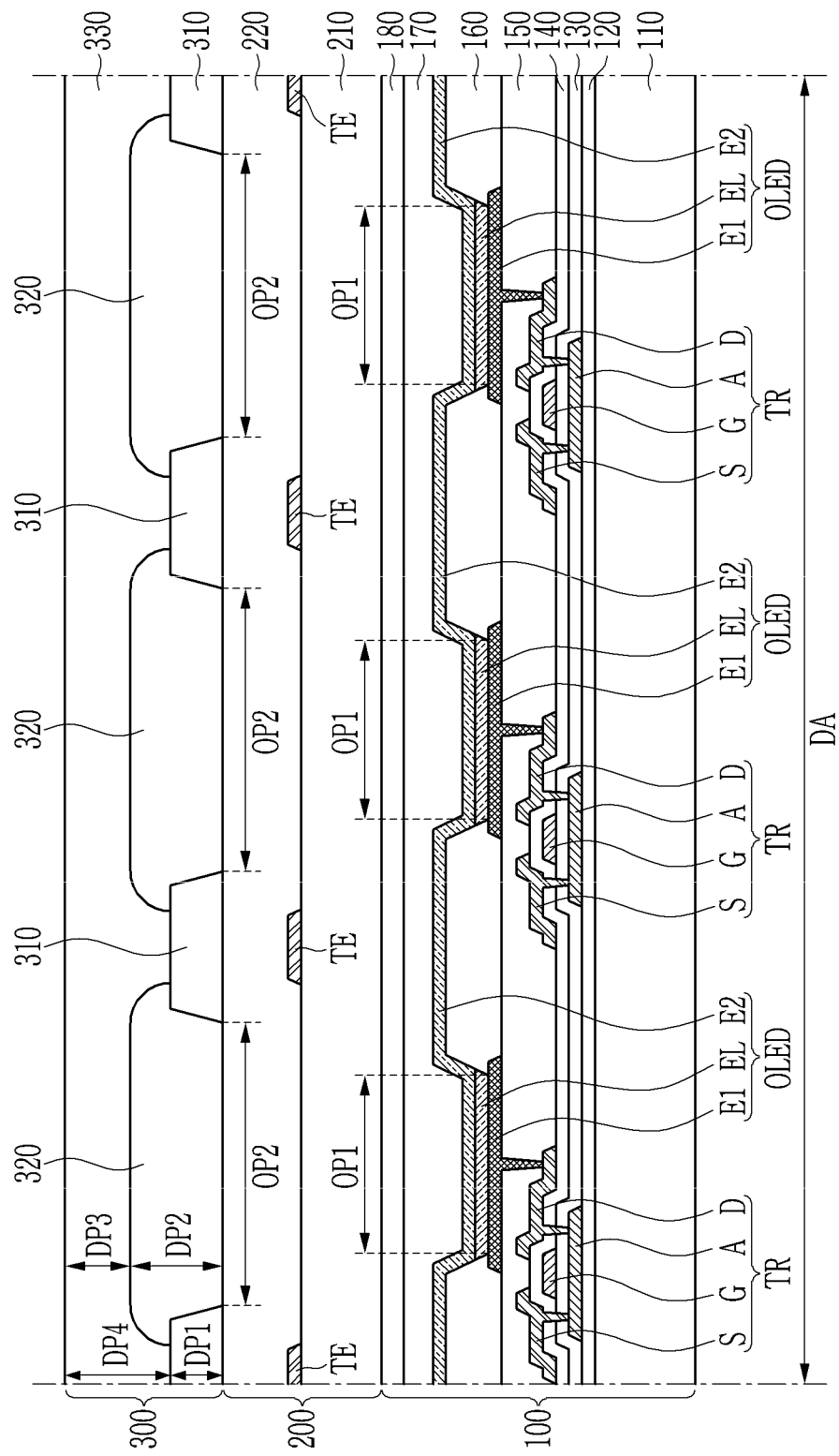
FIG. 2 is a cross-sectional view of an exemplary embodiment of the display area of FIG. 1.
Figure 3:
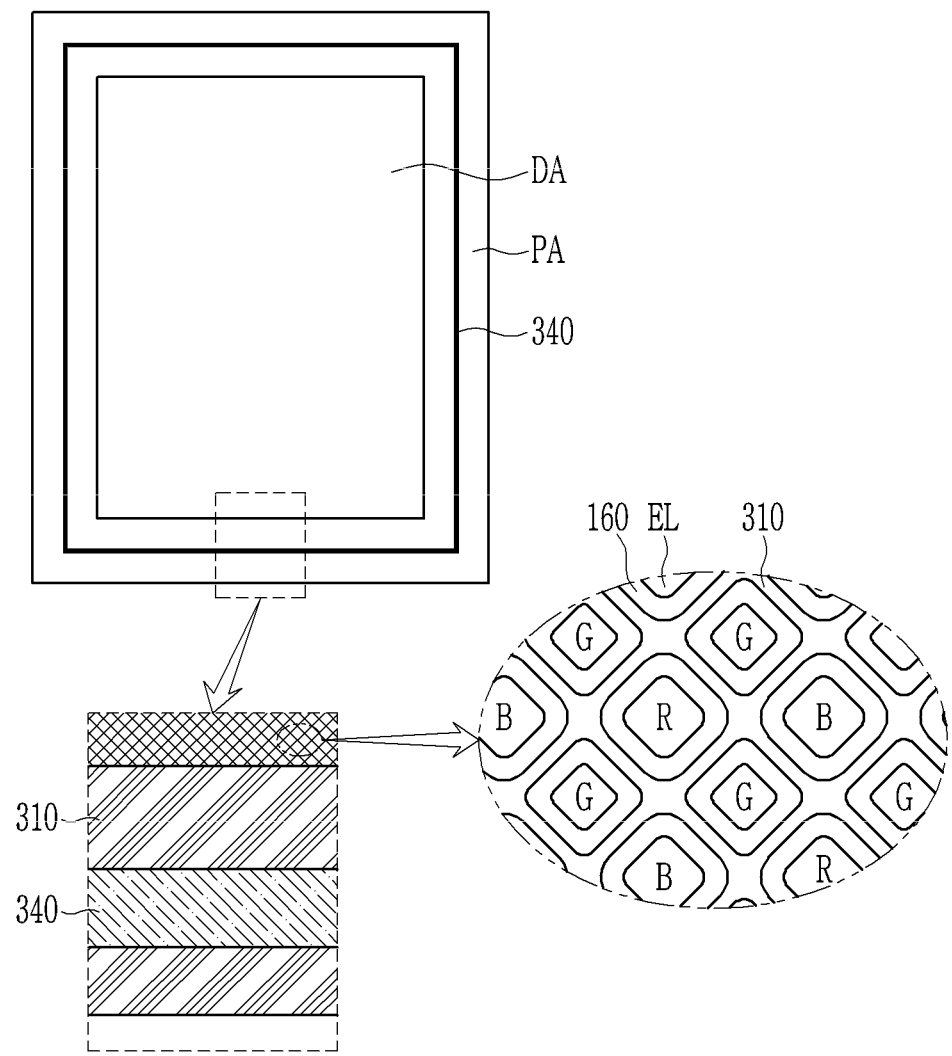
FIG. 3 is a top plan view of an exemplary embodiment of the display device of FIG. 1.

FIG. 1 is a cross-sectional view of portions of a peripheral area and a display area of a display device constructed according to the principles of the invention. FIG. 2 is a cross-sectional view of an exemplary embodiment of the display area of FIG. 1. FIG. 3 is a top plan view of an exemplary embodiment of the display device of FIG. 1.

Referring to FIG. 1 to FIG. 3, the display device includes a display layer 100, a touch sensor layer 200, and a cover layer. The display layer 100 includes a plurality of pixels to display an image. The touch sensor layer 200 is disposed on the display layer 100 and detects a contact touch or non-contact touch of a user. The cover layer may be in the form of a protective layer, such as an encapsulating layer 300, which is disposed on the touch sensor layer 200 and encapsulates the display layer 100 and the touch sensor layer 200 to protect them.

In a plan view, the display layer 100 may include a display area DA for displaying an image and a peripheral area PA disposed around the display area DA. The display area DA includes a plurality of pixels. The display area DA corresponds to a screen on which an image is displayed. In the peripheral area PA, circuits and/or signal lines for generating and/or delivering various signals to the plurality of pixels are disposed. The peripheral area PA may at least partially surround the display area DA.

First, a stacked structure of the display layer 100 and the touch sensor layer 200 in the display area DA will be described in detail.

The display layer 100 may include a substrate 110, a transistor TR disposed on the substrate 110, and an organic light emitting diode OLED connected to the transistor TR.

The substrate 10 may be a flexible substrate formed of a polymer such as polyimide (PI), polyamide (PA), polyethylene terephthalate (PET), and the like.

A first insulating layer 120 is disposed on the substrate 110. The first insulating layer 120 may serve to block impurities diffused from the substrate 110 to a semiconductor layer A in a process of forming the semiconductor layer A and to reduce stress applied to the substrate 100. The first insulating layer 120 may include an inorganic insulating material such as a silicon oxide or a silicon nitride.

The semiconductor layer A of the transistor TR is disposed on the first insulating layer 120. The semiconductor layer A may include a channel region overlapping a gate electrode G, and doped source and drain regions at opposite sides thereof. The semiconductor layer A may include polycrystalline silicon, amorphous silicon, or an oxide semiconductor.

A second insulating layer 130 is disposed on the semiconductor layer A. The second insulating layer 130 may include an inorganic insulating material. The second insulating layer 130 may be referred to as a gate insulating layer.

A gate conductor including the gate electrode G of the transistor TR is disposed on the second insulating layer 120. The gate conductor may include a metal such as molybdenum (Mo), copper (Cu), aluminum (Al), silver (Ag), chromium (Cr), tantalum (Ta), and titanium (Ti), or a metal alloy thereof.

A third insulating layer 140 is disposed on the second insulating layer 130 and the gate conductor. The third insulating layer 140 may include an inorganic insulating material. The third insulating layer 140 may be referred to as an interlayer insulating layer.

A data conductor including a source electrode S and a drain electrode D of the transistor TR is disposed on the third insulating layer 140. The source electrode S and the drain electrode D are connected to a source region and a drain region of the semiconductor layer A through contact holes formed in the second insulating layer 130 and the third insulating layer 140, respectively. The data conductors may include a metal or a metal alloy.

The gate electrode G, the source electrode S, the drain electrode D, and the semiconductor layer A form a transistor TR.

A fourth insulating layer 150 is disposed on the data conductor. The fourth insulating layer 150 may include an organic insulating material such as polyimide, an acrylic polymer, or a siloxane polymer. The fourth insulating layer 150 may be referred to as a planarization layer.

A first electrode E1 of the organic light emitting diode OLED is disposed on the fourth insulating layer 150. The first electrode E1 may be connected to the drain electrode D through a contact opening formed in the fourth insulating layer 150. The first electrode E1 may include a metal such as Ag, Ni, Au, Pt, Al, Cu, AlNd, and AlNiLa, or a metal alloy. The first electrode E1 may include a transparent conductive material such as an indium tin oxide (ITO), an indium zinc oxide (IZO), or the like.

A fifth insulating layer 160 provided with an opening OP1 overlapping the first electrode E1 is disposed on the fourth insulating layer 150. The opening OP1 of the fifth insulating layer 160 may define a pixel area of each of the plurality of pixels, and the fifth insulating layer 160 may be referred to as a pixel defining layer. The pixel area may mean an area occupied by a light emitting layer EL of the organic light emitting diode OLED in a plan view. The fifth insulating layer 160 may include an organic insulating material. The fifth insulating layer 160 may include a black pigment, and the transistors TR and the various signal lines disposed under the fifth insulating layer 160 may not be visible to the user.

The light emitting layer EL is disposed on the first electrode E1. The light emitting layer EL is disposed in the pixel area defined by the opening OP1 of the fifth insulating layer 160.

The second electrode E2 is disposed on the light emitting layer EL. The second electrode E2 may cover all of the display area DA. A common voltage may be applied to the second electrode E2. The second electrode E2 may be formed as a relatively thin layer of a metal having a low work function such as calcium (Ca), barium (Ba), magnesium (Mg), aluminum (Al), silver (Ag) or the like, so that it may have light transmittance. The second electrode E2 may include a transparent conductive material such as an indium tin oxide (ITO), an indium zinc oxide (IZO), or the like.

The first electrode E1, the light emitting layer EL, and the second electrode E2 form an organic light emitting diode OLED of one pixel. The first electrode E1 may be an anode of the organic light emitting diode OLED, and the second electrode E2 may be a cathode of the organic light emitting diode OLED. The first electrode E1 may be referred to as a pixel electrode, and the second electrode E2 may be referred to as a common electrode. A plurality of organic light emitting diodes OLED included in the display layer 100 may emit three primary colors. For example, a plurality of organic light emitting diodes OLED may include a red organic light emitting diode (for example, R in FIG. 3) emitting red light, a green organic light emitting diode (for example, G in FIG. 3) emitting green light, and a blue organic light emitting diode (for example, B in FIG. 3) emitting blue light. In FIG. 2, one of the three organic light emitting diodes OLED is a red organic light emitting diode, another thereof is a green organic light emitting diode, and the other is a blue organic light emitting diode.

A sixth insulating layer 170 is disposed on the second electrode E2. The sixth insulating layer 170 covers all of the display area DA to seal the organic light emitting diode OLED. The sixth insulating layer 170 may include an organic insulating material.

A seventh insulating layer 180 may be disposed on the sixth insulating layer 170. The seventh insulating layer 180 may cover all of the display area DA. The seventh insulating layer 180 may include an inorganic insulating material. The sixth insulating layer 170 including the organic insulating material is more flexible than the seventh insulating layer 180 including the inorganic insulating material. The seventh insulating layer 180 including the inorganic insulating material is superior in moisture-proofing effect compared to the sixth insulating layer 170 including the organic insulating material.

The touch sensor layer 200 may include an eighth insulating layer 210, a ninth insulating layer 220, and a plurality of touch electrodes TE.

The eighth insulating layer 210 is disposed on the seventh insulating layer 180, and the ninth insulating layer 220 is disposed on the eighth insulating layer 210. The ninth insulating layer 220 may cover all of the display area DA. The eighth insulating layer 210 and the ninth insulating layer 220 may include an organic insulating material.

The plurality of touch electrodes TE are disposed between the eighth insulating layer 210 and the ninth insulating layer 220. The plurality of touch electrodes TE may be disposed between adjacent pixel areas without overlapping the opening OP1 of the fifth insulating layer 160. The plurality of touch electrodes TE may include a plurality of transmitting electrodes for transmitting a touch signal for touch detection, and a plurality of receiving electrodes for forming a capacitance with the transmitting electrodes. A plurality of transmitting electrodes and a plurality of receiving electrodes may cross each other, and a plurality of transmitting electrodes or a plurality of receiving electrodes may be connected to each other through a contact opening formed in the eighth insulating layer 210 at crossing points.

Next, the stacked structure of the encapsulating layer 300 in the display area DA and the peripheral area PA will be described. In the peripheral area PA, the display layer 100 does not include the organic light emitting diode OLED, and the touch sensor layer 200 may not include the touch electrode TE. A plurality of insulating layers and a plurality of signal lines may be disposed in the display layer 100 and the touch sensor layer 200 in the peripheral area PA. Structures of the display layer 100 and the touch sensor layer 200 in the peripheral area PA are not limited, and detailed structures of the display layer 100 and the touch sensor layer 200 in the peripheral area PA are omitted for clarity.

The encapsulating layer 300 may include a light blocking portion 310, a plurality of color filters 320, an overcoating layer 330, and a first protrusion which may be in the form of a dam 340.

The light blocking portion 310 includes a plurality of openings OP2 corresponding to the plurality of openings OP1 of the fifth insulating layer 160 in the display area DA. The light blocking portion 310 may cover all of the peripheral area PA to block light in the peripheral area PA. The light blocking portion 310 may include an organic material or a mixture of an inorganic material and an organic material, which includes a black pigment to block the light.

The plurality of openings OP2 of the blocking portion 310 may overlap the plurality of openings OP1 of the fifth insulating layer 160. The light blocking portion 310 may have the same planar pattern as the fifth insulating layer 160 in the display area DA. For example, as shown in FIG. 3, a plurality of pixels may be arranged in a form of a fan-tile in a plan view, and the light blocking portion 310 may have the same planar pattern (for example, a mesh pattern) as the fifth insulating layer 160. Here, each pixel may correspond to a pixel area where light of the light emitting layer EL is emitted. The light blocking portion 310 may include an opening OP2 having a wider width than the width of the opening OP1 (that is, the pixel area in which light of the light emitting layer EL is emitted) of the fifth insulating layer 160. For example, the distance between the neighboring openings OP1 of the fifth insulating layer 160 may be about 16 μm to 17 μm, and the a distance between the neighboring openings OP2 of the light blocking portion 310 may be about 6 μm to 7 μm.

The plurality of color filters 320 are disposed on the light blocking portion 310. The plurality of color filters 320 overlap the plurality of openings OP2 of the light blocking portion 310. The plurality of color filters 320 may include a color filter of a color corresponding to a color emitted by the organic light emitting diode OLED. The plurality of color filters 320 may include a first color filter of a first color, a second color filter of a second color, and a third color filter of a third color. The first color filter, the second color filter, and the third color filter overlap different openings OP2 of the light blocking portion 310. For example, the plurality of color filters 320 may include a red color filter, a green color filter, and a blue color filter. The red color filter overlaps a red organic light emitting diode, the green color filter overlaps a green organic light emitting diode, and the blue color filter can overlap a blue organic light emitting diode.

The plurality of color filters 320 may include a color dye or a quantum dot material. A core of the quantum dot may be selected from Group II-VI compounds, Group III-V compounds, Group IV-VI compounds, Group IV elements, Group IV compounds, and combinations thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from AgInS, CuInS, CdSeS, CdSeTe, CdSTe, InZnP, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a two-element compound selected from GaN, GaP, GaAs, GaSb, AlN, AlP, AlAs, AlSb, InN, InP, InAs, InSb, and a mixture thereof a three-element compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof; and a four-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may be present in particles at substantially uniform concentrations, or they may be divided into states having partially different concentrations to be present in the same particle, respectively. In addition, a core/shell structure in which some quantum dots enclose some other quantum dots may be possible. An interface between the core and the shell may have a concentration gradient in which a concentration of elements of the shell decreases closer to its center.

In some embodiments, the quantum dot may have a core-shell structure that includes a core including nanocrystal and a shell surrounding the core. The shell of the quantum dot may serve as a passivation layer for maintaining a semiconductor characteristic and/or as a charging layer for applying an electrophoretic characteristic to the quantum dot by preventing chemical denaturation of the core. The shell may be a single layer or a multilayer. An interface between the core and the shell may have a concentration gradient in which a concentration of elements of the shell decreases closer to its center. An example of the shell of the quantum dot includes a metal or nonmetal oxide, a semiconductor compound, or a combination thereof.

For example, the metal or nonmetal oxide may be a two-element compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, and the like, or a three-element compound such as $MgAl_2O_4$, $CoFe_2O_4$, $NiFe_2O_4$, $CoMn_2O_4$, and the like, but the exemplary embodiments are not limited thereto.

In addition, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the exemplary embodiments are not limited thereto.

The quantum dot may have a full width at half maximum (FWHM) of the light-emitting wavelength spectrum that is equal to or less than about 45 nm, preferably equal to or less than about 40 nm, and more preferably equal to or less than about 30 nm, and in this range, color purity or color reproducibility may be improved. In addition, since light emitted through the quantum dot is emitted in all directions, the viewing angle of light may be improved.

Further, the shape of the quantum dot is not particularly limited to a particular shape generally used in the art, but may have a spherical, pyramidal, multi-arm, or cubic nanoparticle, nanotube, nano-wire, nano-fiber, or nano-plate particle shape, and the like.

The quantum dot may control the color of emitted light according to the particle size thereof, and thus the quantum dot may have various light emitting colors such as blue, red, and green colors.

The first dam 340 is disposed on the light blocking portion 310 in the peripheral area PA. The first dam 340 may completely surround the display area DA along the peripheral area PA. The first dam 340 may include one to three layers simultaneously formed with one to three of the first to third color filters. FIG. 1 illustrates a case in which the first dam 340 includes a first layer 341, a second layer 342, and a third layer 343.

When the first color filter, the second color filter, and the third color filter are sequentially formed in the display area DA, the first layer 341 of the first dam 340 in the peripheral area PA may be formed together with the first color filter, the second layer 342 may be formed on the first layer 341 together with the second color filter, and the third layer 343 may be formed on the second layer 342 together with the third color filter. Accordingly, the first layer 341 is made of the same material as the first color filter, the second layer 342 is made of the same material as the second color filter, and the third layer 343 is made of the same material as the third color filter.

The first color filter is one of a red color filter, a green color filter, and a blue color filter, the second color filter is one of the other colors thereof, and the third color filter may be the other thereof.

The overcoating layer 330 is disposed on the light blocking portion 310 and the color filter 320 and covers all of the display area DA. The overcoating layer 330 contacts a lateral surface LS of the first dam 340 in the peripheral area PA. The overcoating layer 330 includes a transparent organic material or a mixture of an inorganic material and an organic material, and may be formed by an inkjet coating method. The overcoating layer 330 may include an ultraviolet wavelength blocking agent (which may be referred to as an ultraviolet absorbing agent). The ultraviolet wavelength blocking agent is a material capable of absorbing light in a range of wavelengths of ultraviolet rays, and it may include a material capable of absorbing light in the range of wavelengths of ultraviolet rays, such as hydroxyphenyl-benzophenone, hydroxyphenyl-benzophenone, oxalic acid amide, triazine, oxalanilide, cyanoacrylate, salicylic acid, hydroxyphenylpyrimidine, and the like. However, the ultraviolet wavelength blocking agent is not limited thereto. Since the overcoating layer 330 includes the ultraviolet wavelength blocking agent, the overcoating layer 330 may prevent external ultraviolet rays from being transmitted to the inside of the overcoating layer 330, and may prevent characteristics of the organic light emitting diode OLED from being changed by the external ultraviolet rays.

The first dam 340 blocks an overcoating material forming the overcoating layer 330 from flowing out of the peripheral area PA when the overcoating layer 330 is formed in the display area DA.

The light blocking portion 310 may be formed to have a first thickness DP1, and the color filter 320 may be formed to have a second thickness DP2 that is greater than the first thickness DP1. The overcoating layer 330 may be formed to have a third thickness DP3 at a portion overlapping the color filter 320, and a fourth thickness DP4 in a portion that does not overlap the color filter 320 (a portion in contact with the light blocking portion 310), as shown in FIG. 2. A sum of the first thickness DP1 and the fourth thickness DP4 is substantially equal to a sum of the second thickness DP2 and the third thickness DP3. That is, an upper surface of the overcoating layer 330 is formed substantially flat. For example, the first thickness DP1 may be about 1.1 μm, the second thickness DP2 may be about 2.7 μm, the third thickness DP3 may be about 1.5 μm, and the fourth thickness DP4 may be about 3.1 μm.

Respective thicknesses of the first layer 341, the second layer 342, and the third layer 343 of the first dam 340 may be the same as the second thickness DP2 of the color filter 320. In the illustrated embodiment of FIG. 1, the first dam 340 may be formed to have a thickness that is three times the second thickness DP2. Since the thickness of the first dam 340 is greater than the fourth thickness DP4 of the overcoating layer 330, the first dam 340 may block the overcoating material from flowing out of the peripheral area PA. The fourth thickness DP4 of the overcoating layer 330 may be determined within a range not exceeding the thickness of the first dam 340.

The first dam 340 may be formed as two layers or one layer according to the fourth thickness DP4 of the overcoating layer 330. This will be described later in FIG. 5 and FIG. 6.

The first layer 341 may be formed with a first width W1, the second layer 342 may be formed with a second width W2, and the third layer 343 may be formed with a third width W3. The widths of the first layer 341, the second layer 342, and the third layer 343 mean lengths in a direction generally perpendicular to boundaries between the display area DA and the peripheral area PA (a direction generally parallel to a surface of the substrate 110). The first width W1 of the first layer 341 is smaller than the width of the peripheral area PA. The first dam 340 may be formed so that its width gradually decreases from a lower layer thereof to an upper layer thereof. As shown in FIG. 1, the second width W2 of the second layer 342 may be smaller than the first width W1 of the first layer 341, and the third width W3 of the third layer 343 may be smaller than the second width W2 of the second layer 342.

Figure 4A:
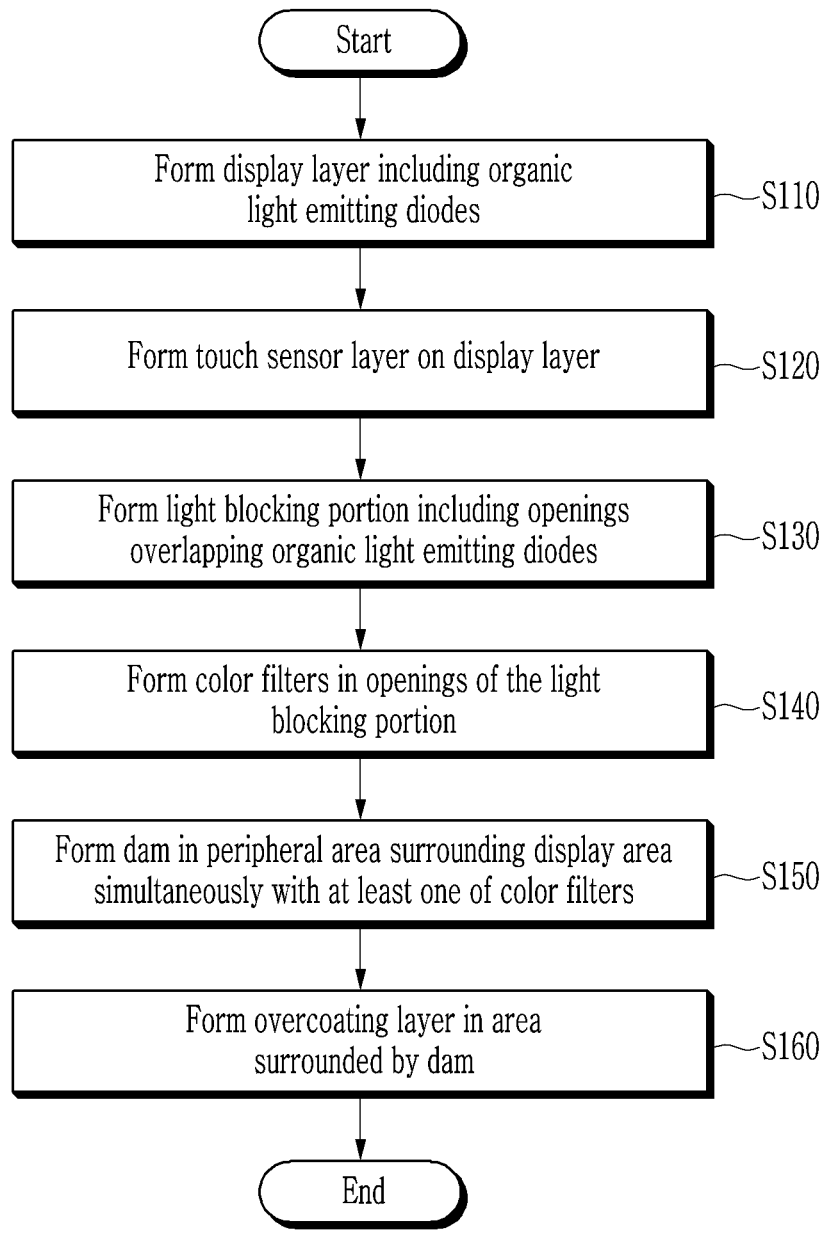
FIG. 4A is a flowchart of a method of manufacturing a display device according to the principles of the invention.
Figure 4B:
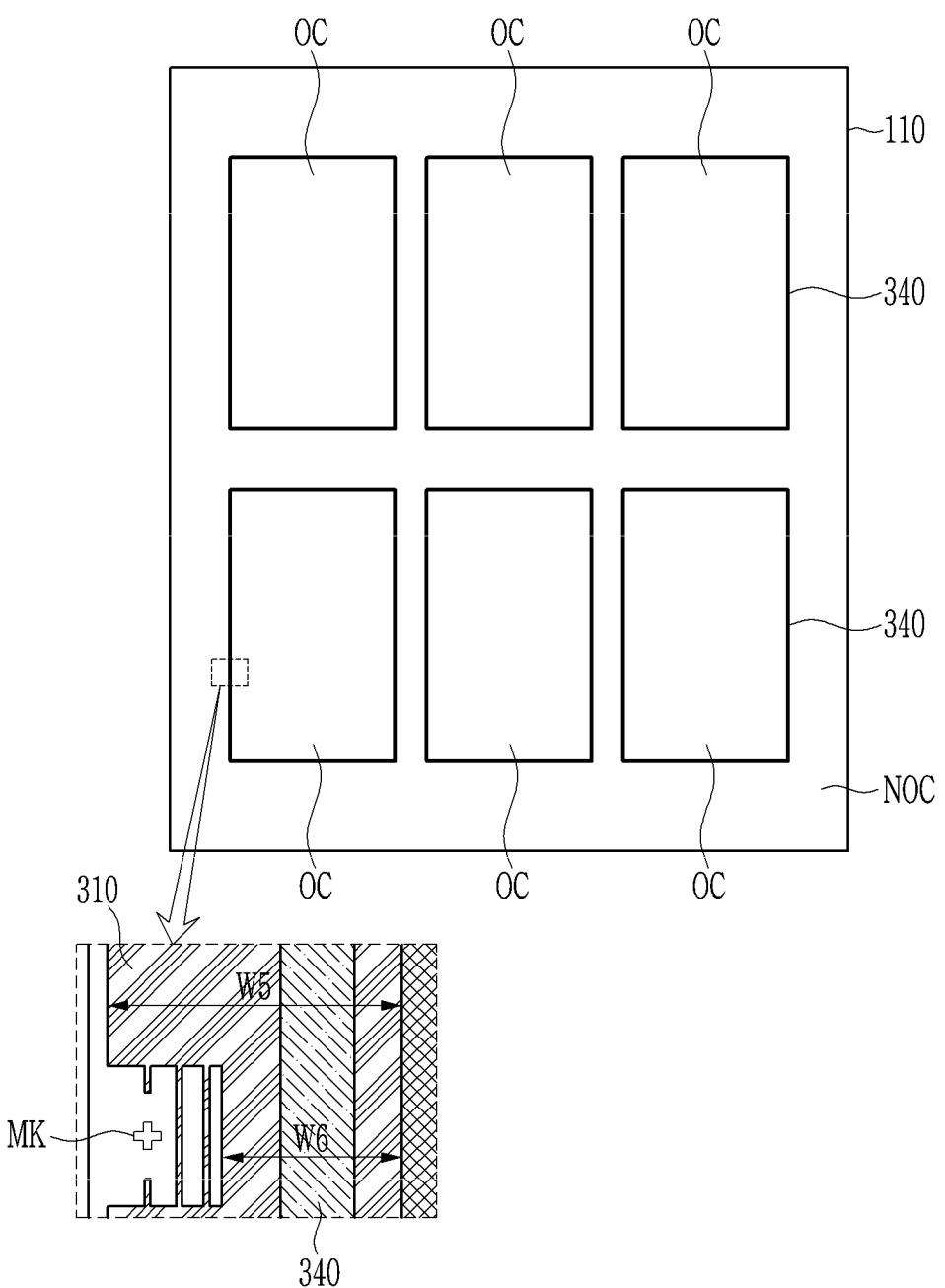
FIG. 4B is a top plan view illustrating an exemplary embodiment of areas in which overcoating materials are formed in one of the exemplary processes of manufacturing display devices according to the principles of the invention.

FIG. 4A is a flowchart of a method of manufacturing a display device according to the principles of the invention. FIG. 4B is a top plan view illustrating an exemplary embodiment of areas in which overcoating materials are formed in one of the exemplary processes of manufacturing display devices according to the principles of the invention.

A method of manufacturing the display device described in FIG. 1 to FIG. 3 will be described with referring to FIGS. 4A and 4B. Six display devices may be manufactured on one substrate 110 by the same process.

Referring to FIGS. 1-3 and 4A, at step S110, the display layer 100 including a plurality of transistors TR and a plurality of organic light emitting diodes OLED is formed. At step S120, the touch sensor layer 200 including a plurality of touch electrodes TE is formed on the display layer 100.

At step S130, the light blocking portion 310 including the plurality of openings OP2 corresponding to and/or overlapping the plurality of organic light emitting diodes OLED is formed on the touch sensor layer 200. Referring to FIG. 4B, a mask key MK serving as a positional reference of a mask for forming the color filter 320 may be disposed in the peripheral area PA. The light blocking portion 310 is formed so as to cover the peripheral area PA except for a portion of the peripheral area PA in which the mask key MK is formed. Accordingly, the light blocking portion 310 has a maximum width W5 and a minimum width W6 in the peripheral area PA. For example, in the peripheral area PA, the maximum width W5 of the light blocking portion 310 is about 1450 μm, and the minimum width W6 of the light blocking portion 310 may be about 900 μm.

Referring back to FIGS. 1-3 and 4A, at step S140, a plurality of color filters 320 are formed in the plurality of openings OP2 of the light blocking portion 310. The plurality of color filters 320 may include a first color filter, a second color filter, and a third color filter corresponding to colors emitted by the organic light emitting diode OLED.

At step S150, when the plurality of color filters 320 are formed, the first dam 340 is formed of the same material as at least one of the plurality of color filters 320 in the peripheral area PA. The first dam 340 may include one to three layers that are simultaneously formed with one to three selected from the first to third color filters. For example, the first dam 340 includes the first layer 341 that may be formed of the same material as the first color filter of the plurality of color filters 320. The first dam 340 may further include the second layer 342 that may be formed on the first layer 341 with the same material as the second color filter of the plurality of color filters 320. The first dam 340 may further include the third layer 343 that may be formed on the second layer 342 with the same material as the third color filter of the plurality of color filters 320.

At step S160, the overcoating layer 330 is formed to cover the display area DA after the first dam 340 is formed. Referring to FIG. 4B, an overcoating material OC is coated in an area surrounded by the first dam 340 by an inkjet coating method. The overcoating material OC may be formed to have a substantially constant thickness in the area surrounded by the first dam 340 without flowing out of the peripheral area PA because of the first dam 340. After the overcoating material OC is formed, the overcoating layer 330 may be formed by baking the overcoating material OC at a predetermined temperature. That is, the overcoating material OC is not coated on an outer region NOC of the first dam 340, and the overcoating layer 330 is not formed on the outer region NOC of the first dam 340.

When a plurality of display devices are manufactured in the same process on one substrate 110, the first dam 340 is first formed before the overcoating layer 330 is formed such that the overcoating material OC may be coated only on the region surrounded by the first dam 340, and the overcoating layer 330 may be formed by performing the baking process without an exposure process and a development process.

When the overcoating material OC is coated without forming the first dam 340, the overcoating material OC should be coated on substantially the entire surface of the substrate 110 so that the overcoating material OC may be coated with a predetermined substantially uniform thickness. Then, an exposure process and a development process for removing the overcoating material OC of the outer area NOC other than the display area DA and the peripheral area PA of the display device should be performed. Electrical characteristics of the organic light emitting diode OLED of the display layer 100 may be changed due to the light of a short wavelength emitted during the exposure process, and thus display quality may be deteriorated. In addition, since the overcoating material OC should be formed up to the outer region NOC, the overcoating material OC may be wasted.

However, since the first dam 340 is first formed before the overcoating layer 330 is formed, it is not required to performed the exposure process and the development process, and it is possible to prevent or at least reduce a characteristic electrical change of the organic light emitting diode OLED according to the exposure process. Also, the overcoating material OC may be coated within the region surrounded by the first dam 340 to prevent the overcoating material OC from being wasted. In addition, while characteristics of an ultraviolet wavelength blocking agent may be changed by the exposure process and the development process, since the exposure process and the development process are not required to form the overcoating layer 330, the ultraviolet wavelength blocking agent may be added to the overcoating material OC, and the overcoating layer 330 may include the ultraviolet wavelength blocking agent to protect the organic light emitting diode OLED from external short wavelengths.

On the other hand, when the first dam 340 is formed, a second protrusion which may be in the form of a dam 350 (see FIG. 9) may be further formed. The second dam 350 may be disposed between the first dam 340 and the display area DA. The second dam 350 will be described later.

Figure 5:
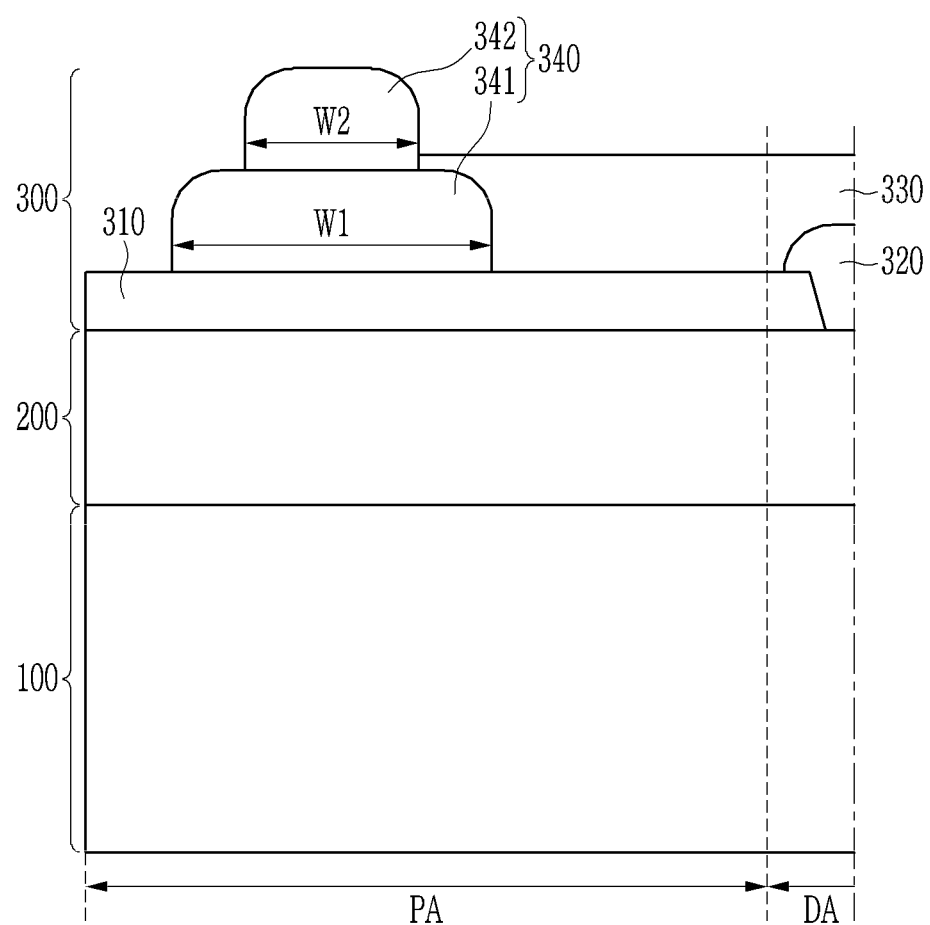
FIG. 5 is a cross-sectional view of portions of a peripheral area and a display area of another exemplary embodiment of a display device constructed according to the principles of the invention.

FIG. 5 is a cross-sectional view of portions of a peripheral area and a display area of another exemplary embodiment of a display device constructed according to the principles of the invention.

Referring to FIG. 5, the first dam 340 includes the first layer 341 and the second layer 342, and the second width W2 of the second layer 342 is smaller than the first width W1 of the first layer 341. That is, FIG. 5 illustrates an exemplary embodiment in which the third layer 343 of the first dam 340 is omitted from the illustrated embodiment of FIG. 1 to FIG. 3. Except for these differences, the features of the embodiment described above with reference to FIG. 1 to FIG. 3 may be the same as the embodiment described with reference to FIG. 5, so descriptions of the repeated features of the embodiment described with reference to FIG. 1 to FIG. 3 will be omitted to avoid redundancy.

Figure 6:
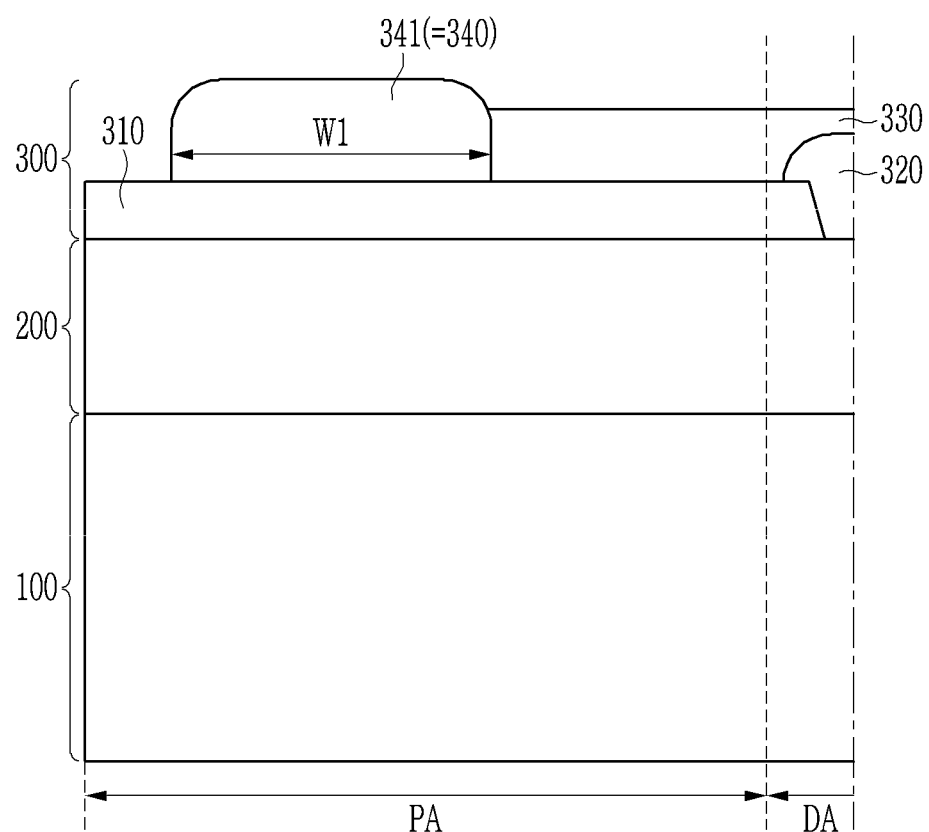
FIG. 6 is a cross-sectional view of portions of a peripheral area and a display area of still another exemplary embodiment of a display device constructed according to the principles of the invention.

FIG. 6 is a cross-sectional view of portions of a peripheral area and a display area of still another exemplary embodiment of a display device constructed according to the principles of the invention.

Referring to FIG. 6, the first dam 340 includes the first layer 341. That is, FIG. 6 illustrates an exemplary embodiment in which the second layer 342 and the third layer 343 of the first dam 340 are omitted in the illustrated embodiment of FIG. 1 to FIG. 3. Except for these differences, the features of the embodiment described above with reference to FIG. 1 to FIG. 3 may be the same as the embodiment described with reference to FIG. 6, so descriptions of the repeated features of the embodiment described with reference to FIG. 1 to FIG. 3 will be omitted to avoid redundancy.

Figure 7:
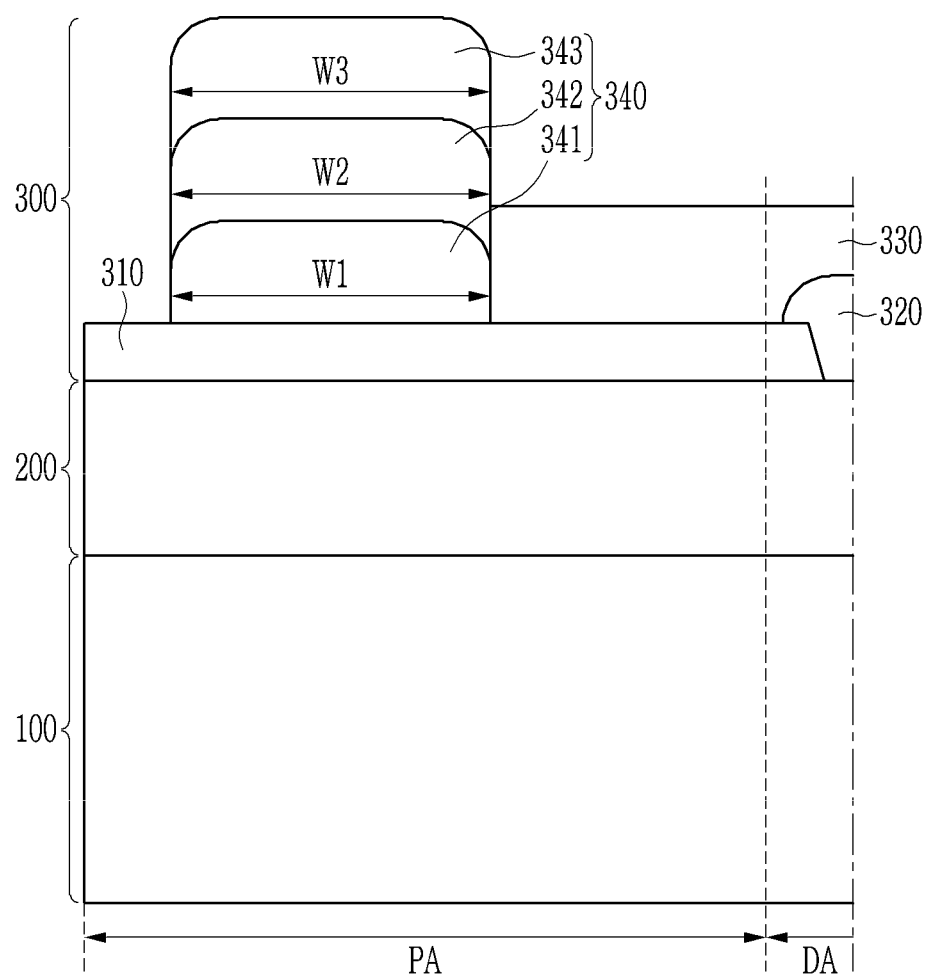
FIG. 7 is a cross-sectional view of portions of a peripheral area and a display area of yet still another exemplary embodiment of a display device.

FIG. 7 is a cross-sectional view of portions of a peripheral area and a display area of yet still another exemplary embodiment of a display device.

Referring to FIG. 7, in the first dam 340, the first width W1 of the first layer 341, the second width W2 of the second layer 342, and the third width W3 of the third layer 343 are substantially the same. That is, the first dam 340 may be formed to have a substantially constant width from the lower layer thereof to the upper layer thereof. Except for these differences, the features of the embodiment described above with reference to FIG. 1 to FIG. 3 may be the same as the embodiment described with reference to FIG. 7, so descriptions of the repeated features of the embodiment described with reference to FIG. 1 to FIG. 3 will be omitted to avoid redundancy.

Figure 8:
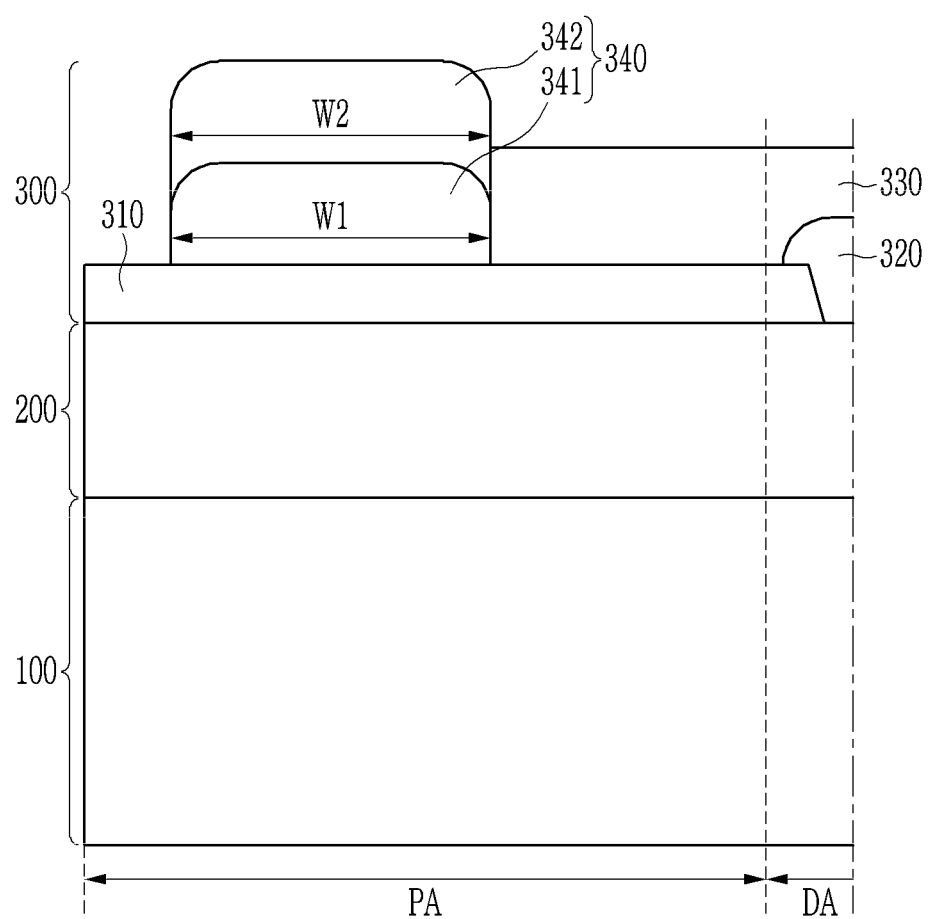
FIG. 8 is a cross-sectional view of portions of a peripheral area and a display area of yet another exemplary embodiment of a display device.

FIG. 8 is a cross-sectional view of portions of a peripheral area and a display area of yet another exemplary embodiment of a display device.

Referring to FIG. 8, the first dam 340 includes the first layer 341 and the second layer 342, and the first width W1 of the first layer 341 and the second width W2 of the second layer 342 are substantially the same as each other. The first dam 340 is formed to have a substantially constant width from the lower layer thereof to the upper layer thereof. Except for these differences, the features of the embodiment described above with reference to FIG. 1 to FIG. 3 may be the same as the embodiment described with reference to FIG. 8, so descriptions of the repeated features of the embodiment described with reference to FIG. 1 to FIG. 3 will be omitted to avoid redundancy.

Hereinafter, exemplary embodiments in which the display device described in FIG. 1 to FIG. 3 further includes a second dam 350 will be described with reference to FIG. 9 to FIG. 15.

Figure 9:
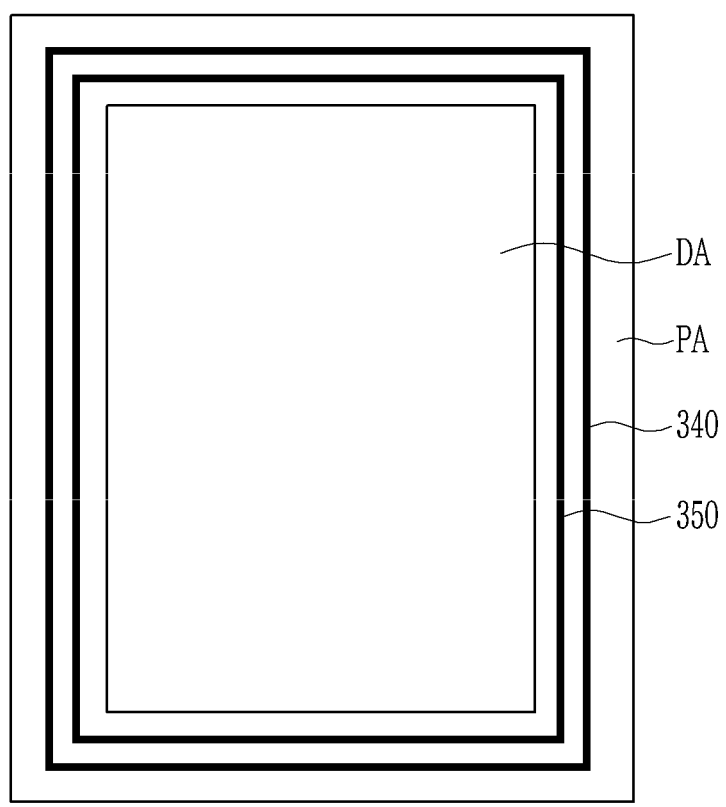
FIG. 9 is a top plan view of a display device constructed according to the principles of the invention.

FIG. 9 is a top plan view of a display device constructed according to the principles of the invention.

Referring to FIG. 9, the display device may further include the second dam 350 disposed between the first dam 340 disposed in the peripheral area PA and the display area DA. The second dam 350 may prevent the overcoating material OC from flowing back to the display area DA after contacting the first dam 340 when the overcoating layer 330 is formed.

The second dam 350 may be disposed in the peripheral area PA and surround the display area DA along the peripheral area PA. The second dam 350 may be disposed in parallel with the first dam 340 at a predetermined interval. In FIG. 9, the second dam 350 is shown as one, but the second dam 350 may be formed as a plurality of dams.

The second dam 350 may include one to three layers, wherein one layer may include the same material as one of the first to third color filters, two layers may include the same material as two of the first to third color filters, and three layers may include the same material as the first to third color filters. The second dam 350, as well as the first dam 340, may be formed simultaneously with at least one of the color filters. The thickness of the second dam 350 is substantially equal to or smaller than that of the first dam 340. This will be described with reference to FIG. 10 to FIG. 15.

Figure 10:
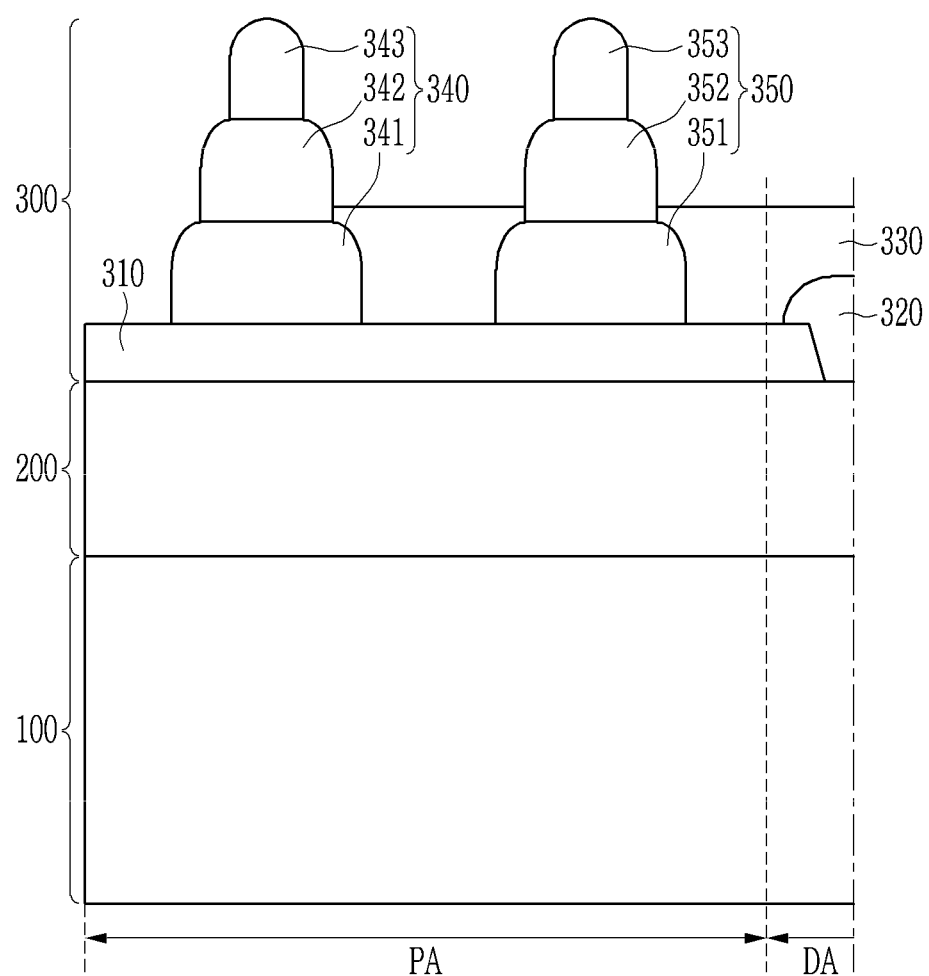
FIG. 10 is a cross-sectional view of portions of a peripheral area and a display area of still another exemplary embodiment of a display device.

FIG. 10 is a cross-sectional view of portions of a peripheral area and a display area of still another exemplary embodiment of a display device.

Referring to FIG. 10, the first dam 340 includes the first layer 341, the second layer 342, and the third layer 343, and the second dam 350 includes a first layer 351, a second layer 352, and a third layer 353.

The first dam 340 and the second dam 350 are formed together when the color filter 320 is formed. The first layer 341 of the first dam 340 and the first layer 351 of the second dam 350 are made of the same material as the first color filter. The second layer 342 of the first dam 340 and the second layer 352 of the second dam 350 are made of the same material as the second color filter. The third layer 343 of the first dam 340 and the third layer 353 of the second dam 350 are made of the same material as the third color filter. The second dam 350 may be formed so that its width gradually decreases from a lower layer thereof to an upper layer thereof. In contrast, the second dam 350 may be formed to have substantially the same width from a lower layer thereof to an upper layer thereof.

Except for these differences, the features of the embodiment described above with reference to FIG. 1 to FIG. 3 may be the same as the embodiment described with reference to FIG. 10, so descriptions of the repeated features of the embodiment described with reference to FIG. 1 to FIG. 3 will be omitted to avoid redundancy.

Figure 11:
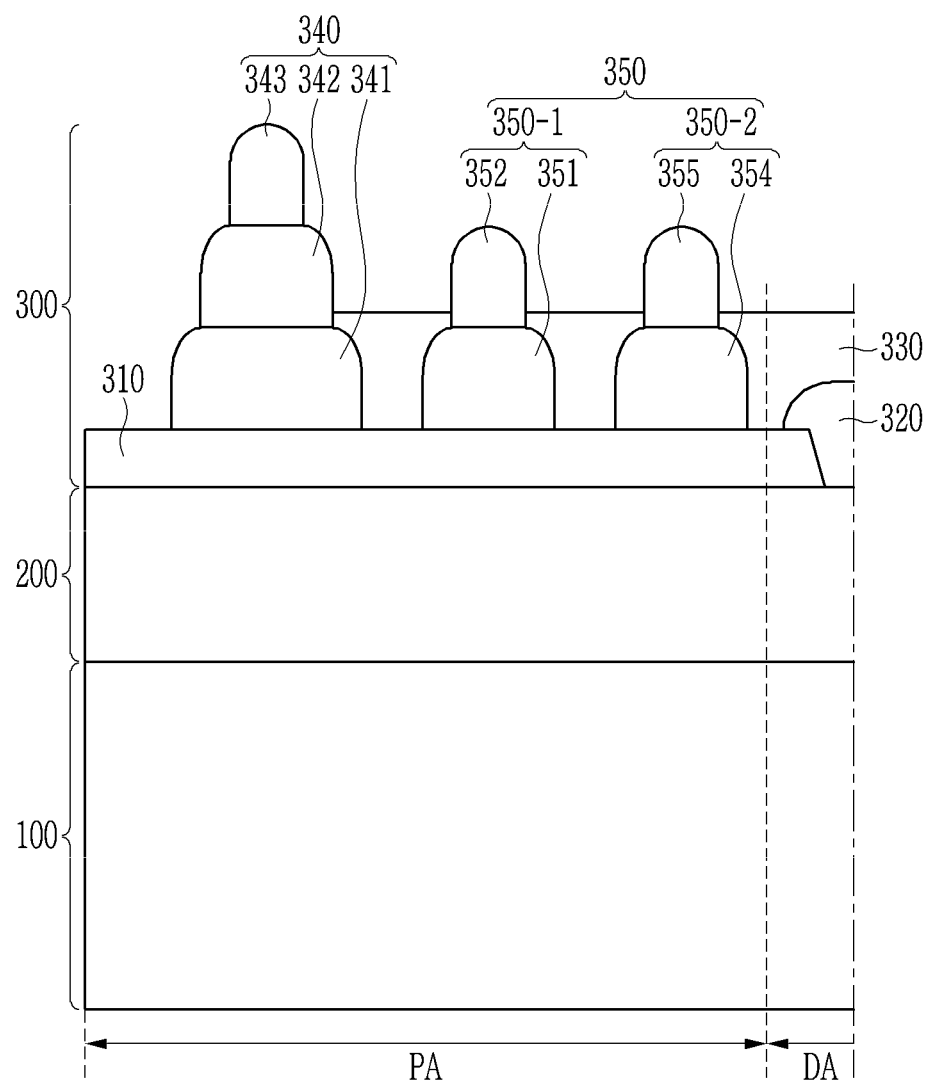
FIG. 11 is a cross-sectional view of portions of a peripheral area and a display area of yet still another exemplary embodiment of a display device.

FIG. 11 is a cross-sectional view of portions of a peripheral area and a display area of yet still another exemplary embodiment of a display device.

Referring to FIG. 11, the second dam 350 is formed in plural. The number of the second dams 350 is not limited. FIG. 11 illustrates an exemplary embodiment in which the second dam 350 includes a first sub-dam 350-1 and a second sub-dam 350-2. The first sub-dam 350-1 includes the first layer 351 and the second layer 352, and the second sub-dam 350-2 includes a first layer 354 and a second layer 355.

The first layer 351 of the first sub-dam 350-1 may be made of the same material as one of the first to third color filters, and the second layer 352 of the first sub-dam 350-1 may be made of the same material as another thereof. The first layer 354 of the second sub-dam 350-2 may be made of the same material as one of the first to third color filters, and the second layer 355 of the second sub-dam 350-2 may be made of the same material as another thereof. In this case, the first layer 351 of the first sub-dam 350-1 and the first layer 354 of the second sub-dam 350-2 may be made of materials of different color filters, and the second layer 352 of the first sub-dam 350-1 and the second layer 355 of the second sub-dam 350-2 may be made of materials of different color filters. The first sub-dam 350-1 and the second sub-dam 350-2 may be formed so that their widths gradually decrease from lower layers thereof to upper layers thereof. In contrast, at least one of the first sub-dam 350-1 and the second sub-dam 350-2 may be formed to have the same width from the lower layers thereof to the upper layers thereof.

Except for these differences, the features of the embodiment described above with reference to FIG. 1 to FIG. 3 may be the same as the embodiment described with reference to FIG. 11, so descriptions of the repeated features of the embodiment described with reference to FIG. 1 to FIG. 3 will be omitted to avoid redundancy.

Figure 12:
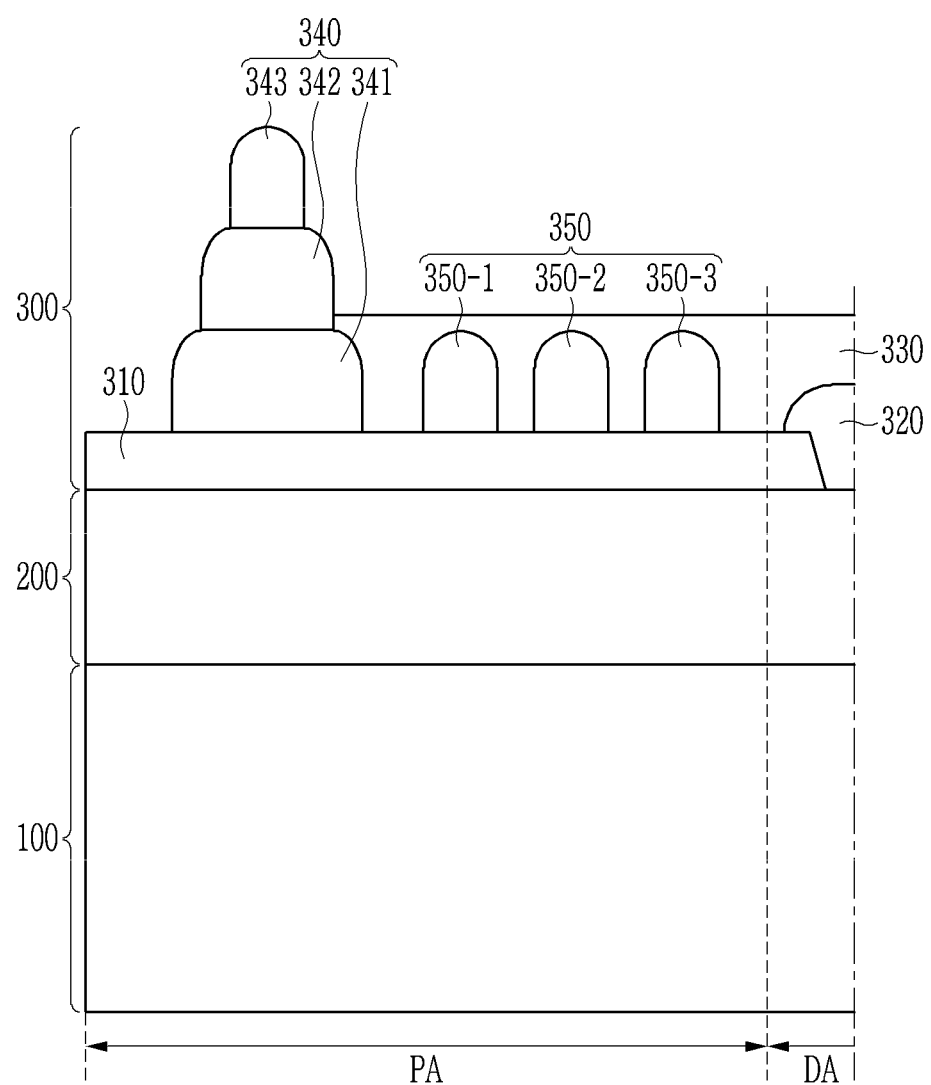
FIG. 12 is a cross-sectional view of portions of a peripheral area and a display area of yet another exemplary embodiment of a display device.

FIG. 12 is a cross-sectional view of portions of a peripheral area and a display area of yet another exemplary embodiment of a display device.

Referring to FIG. 12, the second dam 350 includes a first sub-dam 350-1, a second sub-dam 350-2, and a third sub-dam 350-3. Each of the first sub-dam 350-1, the second sub-dam 350-2, and the third sub-dam 350-3 includes one layer.

Each of the first sub-dam 350-1, the second sub-dam 350-2, and the third sub-dam 350-3 may be made of the same material as one of the first to third color filters. At least two of the first sub-dam 350-1, the second sub-dam 350-2, and the third sub-dam 350-3 may be made of the same color filter material. Alternatively, the first sub-dam 350-1, the second sub-dam 350-2, and the third sub-dam 350-3 may be made of different color filter materials. Each of the first sub-dam 350-1, the second sub-dam 350-2, and the third sub-dam 350-3 may have a smaller size and/or thickness than the first dam 340.

Except for these differences, the features of the embodiment described above with reference to FIG. 1 to FIG. 3 may be the same as the embodiment described with reference to FIG. 12, so descriptions of the repeated features of the embodiment described with reference to FIG. 1 to FIG. 3 will be omitted to avoid redundancy.

Figure 13:
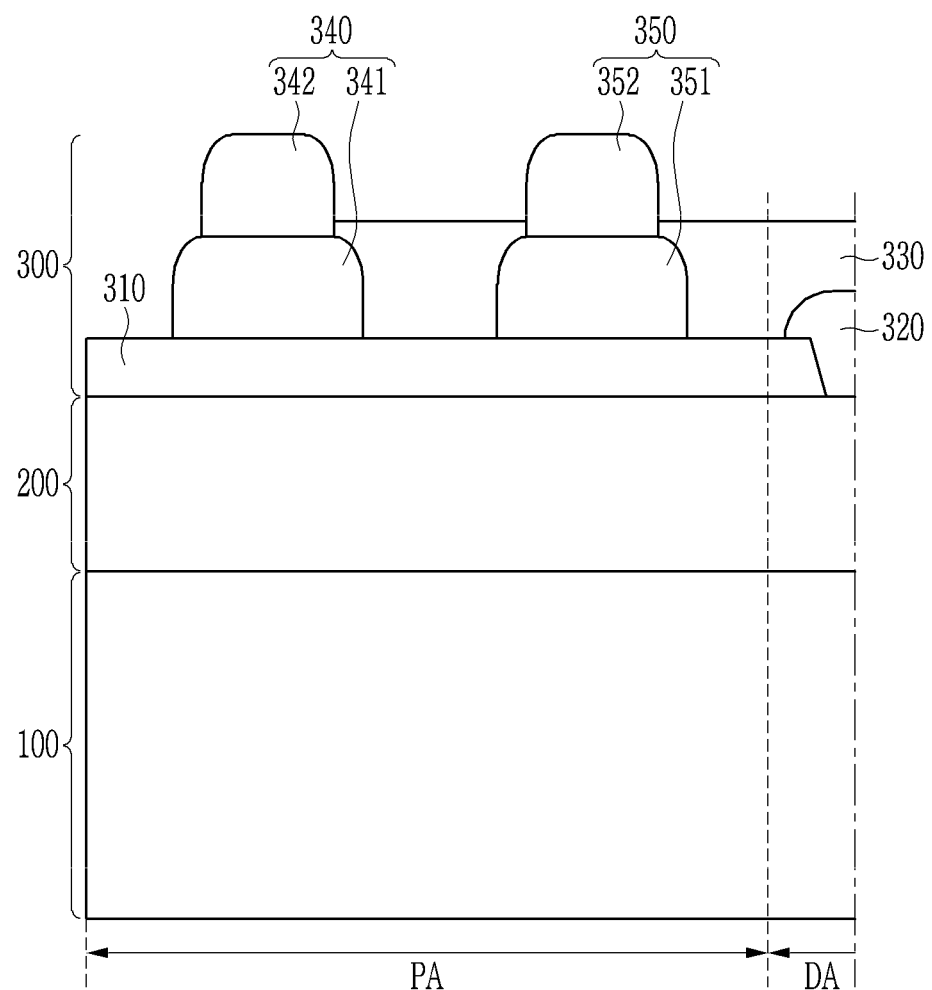
FIG. 13 is a cross-sectional view of portions of a peripheral area and a display area of still another exemplary embodiment of a display device.

FIG. 13 is a cross-sectional view of portions of a peripheral area and a display area of still another exemplary embodiment of a display device.

Referring to FIG. 13, the first dam 340 includes the first layer 341 and the second layer 342, and the second dam 350 may include the first layer 351 and the second layer 352.

The first layer 341 of the first dam 340 may be made of the same material as one of the first to third color filters, and the second layer 342 of the first dam 340 may be made of the same material as another thereof. The first layer 351 of the second dam 350 may be made of the same material as one of the first to third color filters, and the second layer 352 of the second dam 350 may be made of the same material as another thereof.

The first layer 341 of the first dam 340 and the first layer 351 of the second dam 350 may be made of the same color filter material. In this case, the second layer 342 of the first dam 340 and the second layer 352 of the second dam 350 may be made of the same color filter material or different color filter materials.

Alternatively, the first layer 341 of the first dam 340 and the first layer 351 of the second dam 350 may be made of different color filter materials. In this case, the second layer 342 of the first dam 340 and the second layer 352 of the second dam 350 may be made of the same color filter material or different color filter materials.

Except for these differences, the features of the embodiment described above with reference to FIG. 1 to FIG. 3 may be the same as the embodiment described with reference to FIG. 13, so descriptions of the repeated features of the embodiment described with reference to FIG. 1 to FIG. 3 will be omitted to avoid redundancy.

Figure 14:
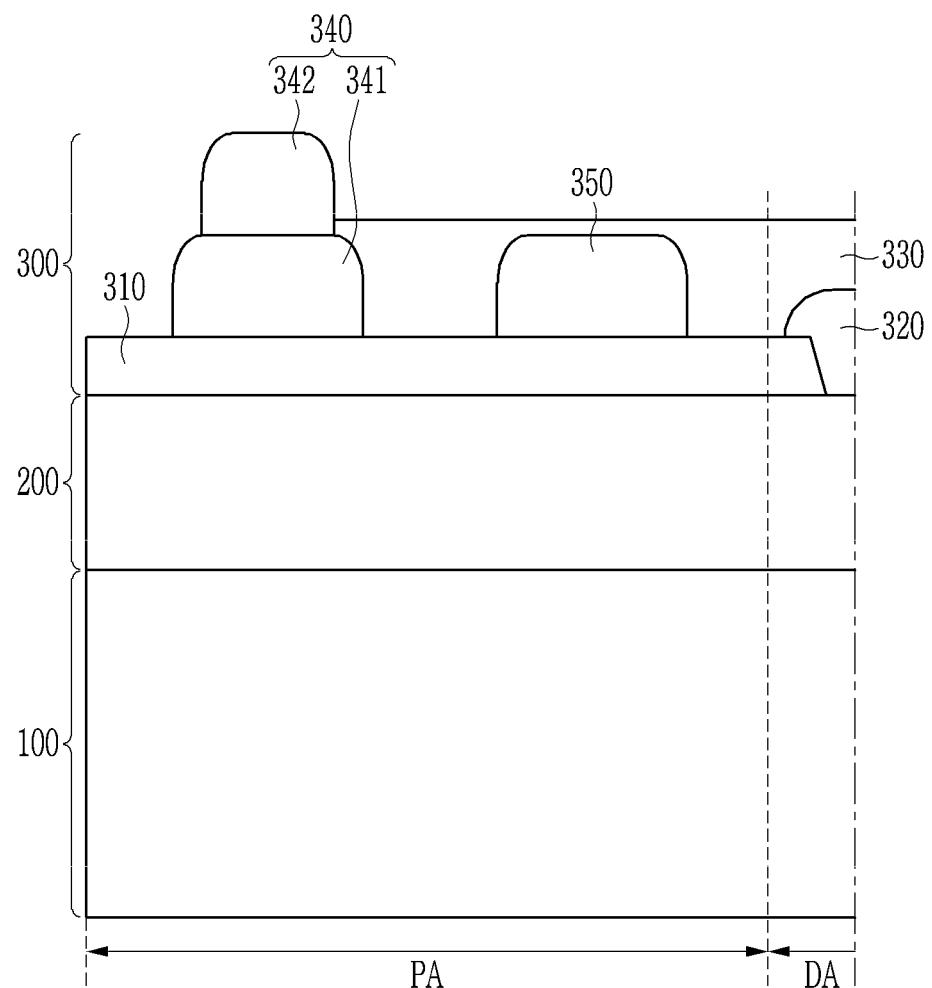
FIG. 14 is a cross-sectional view of portions of a peripheral area and a display area of yet still another exemplary embodiment of a display device.

FIG. 14 is a cross-sectional view of portions of a peripheral area and a display area of yet still another exemplary embodiment of a display device.

Referring to FIG. 14, the first dam 340 includes the first layer 341 and the second layer 342, and the second dam 350 may include one layer.

The first layer 341 of the first dam 340 may be made of the same material as one of the first to third color filters, and the second layer 342 of the first dam 340 may be made of the same material as another thereof. The second dam 350 may be made of the same material as one of the first to third color filters.

The second dam 350 may be made of the same color filter material as the first layer 341 or the second layer 342 of the first dam 340. Alternatively, the second dam 350 may be made of a different color filter material from that of the first layer 341 and the second layer 342 of the first dam 340.

Except for these differences, the features of the embodiment described above with reference to FIG. 1 to FIG. 3 may be the same as the embodiment described with reference to FIG. 14, so descriptions of the repeated features of the embodiment described with reference to FIG. 1 to FIG. 3 will be omitted to avoid redundancy.

Figure 15:
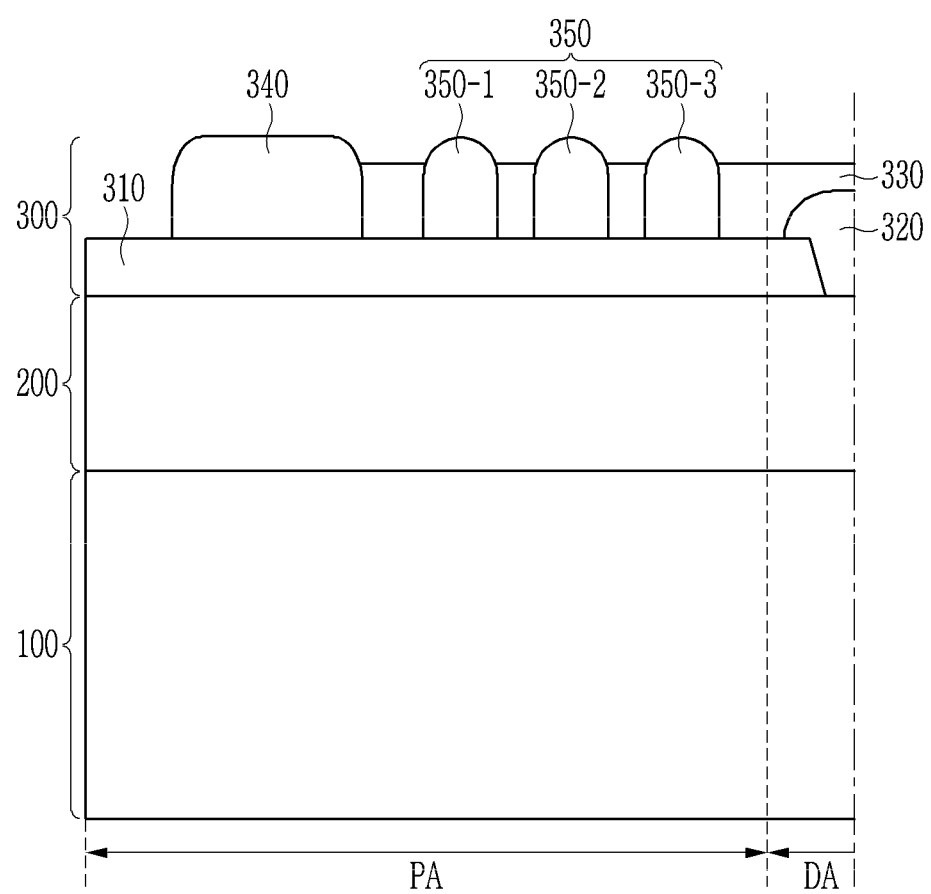
FIG. 15 is a cross-sectional view of portions of a peripheral area and a display area of yet another exemplary embodiment of a display device.

FIG. 15 is a cross-sectional view of portions of a peripheral area and a display area of yet another exemplary embodiment of a display device.

Referring to FIG. 15, the first dam 340 may include one layer, the second dam 350 may include a plurality of sub-dams 350-1, 350-2, and 350-3, and each of the sub-dams 350-1, 350-2, and 350-3 may include one layer.

The first dam 340 may be made of the same material as one of the first to third color filters. Each of the first sub-dam 350-1, the second sub-dam 350-2, and the third sub-dam 350-3 may be made of the same material as one of the first to third color filters. At least two of the first sub-dam 350-1, the second sub-dam 350-2, and the third sub-dam 350-3 may be made of the same color filter material. Alternatively, the first sub-dam 350-1, the second sub-dam 350-2, and the third sub-dam 350-3 may be made of different color filter materials.

Except for these differences, the features of the embodiment described above with reference to FIG. 1 to FIG. 3 may be the same as the embodiment described with reference to FIG. 15, so descriptions of the repeated features of the embodiment described with reference to FIG. 1 to FIG. 3 will be omitted to avoid redundancy.

Figure 16:
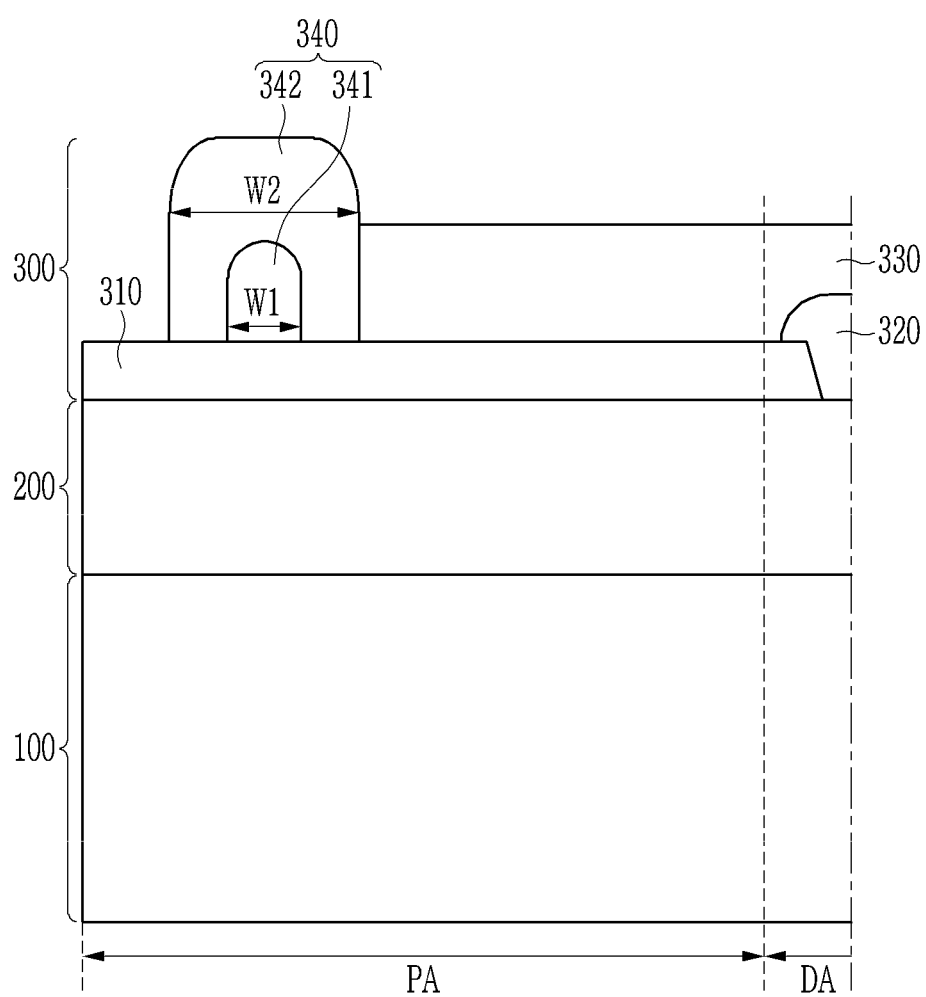
FIG. 16 is a cross-sectional view of portions of a peripheral area and a display area of still another exemplary embodiment of a display device.

FIG. 16 is a cross-sectional view of portions of a peripheral area and a display area of still another exemplary embodiment of a display device.

Referring to FIG. 16, the second width W2 of the second layer 342 of the first dam 340 may be greater than the first width W1 of the first layer 341 of the first dam 340. Accordingly, the first dam 340 may be formed so that the second layer 342 may cover and surround the first layer 341.

Except for these differences, the features of the embodiment described above with reference to FIG. 1 to FIG. 3 may be the same as the embodiment described with reference to FIG. 16, so descriptions of the repeated features of the embodiment described with reference to FIG. 1 to FIG. 3 will be omitted to avoid redundancy.

Figure 17:
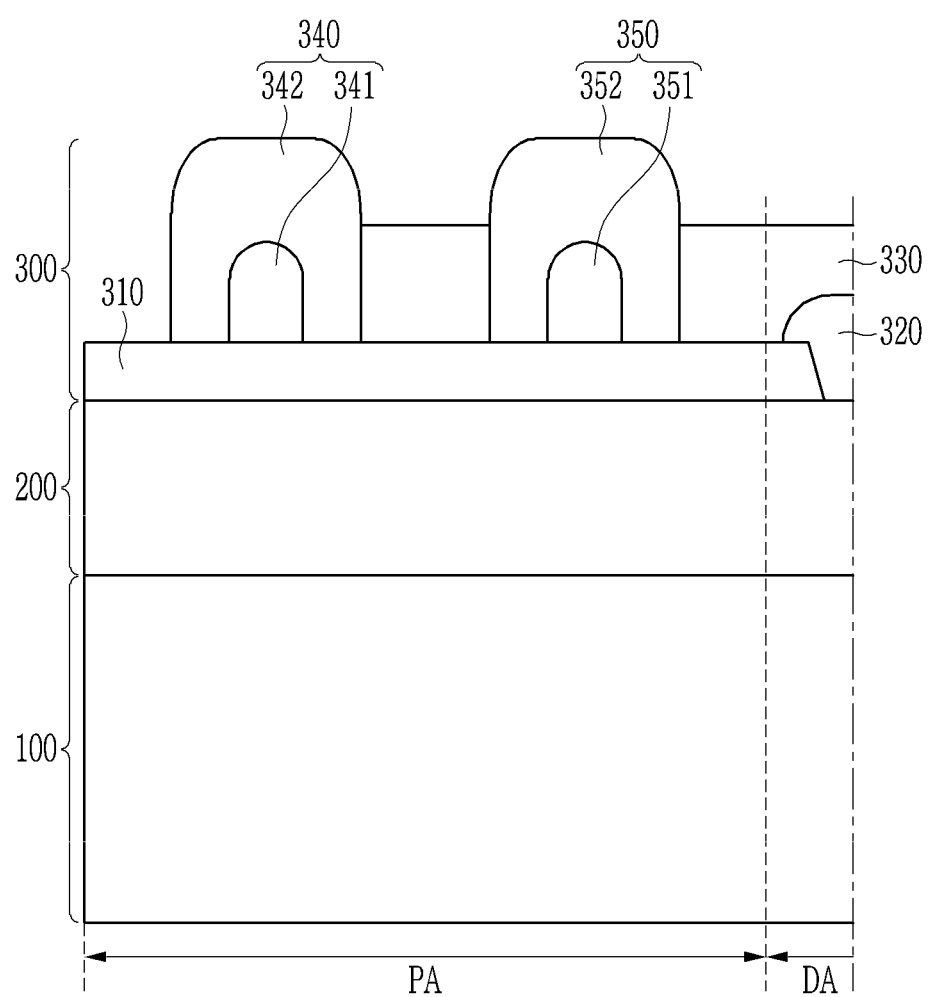
FIG. 17 is a cross-sectional view of portions of a peripheral area and a display area of yet still another exemplary embodiment of a display device.

FIG. 17 is a cross-sectional view of portions of a peripheral area and a display area of yet still another exemplary embodiment of a display device.

FIG. 17 illustrates a case in which the display device of FIG. 16 further includes the second dam 350. The width of the second layer 352 of the second dam 350 may be greater than the width of the first layer 351 of the second dam 350, and the second dam 350 may be formed so that the second layer 352 may cover and surround the first layer 351.

Except for these differences, the features of the embodiment described above with reference to FIG. 1 to FIG. 3 may be the same as the embodiment described with reference to FIG. 17, so descriptions of the repeated features of the embodiment described with reference to FIG. 1 to FIG. 3 will be omitted to avoid redundancy.

Figure 18:
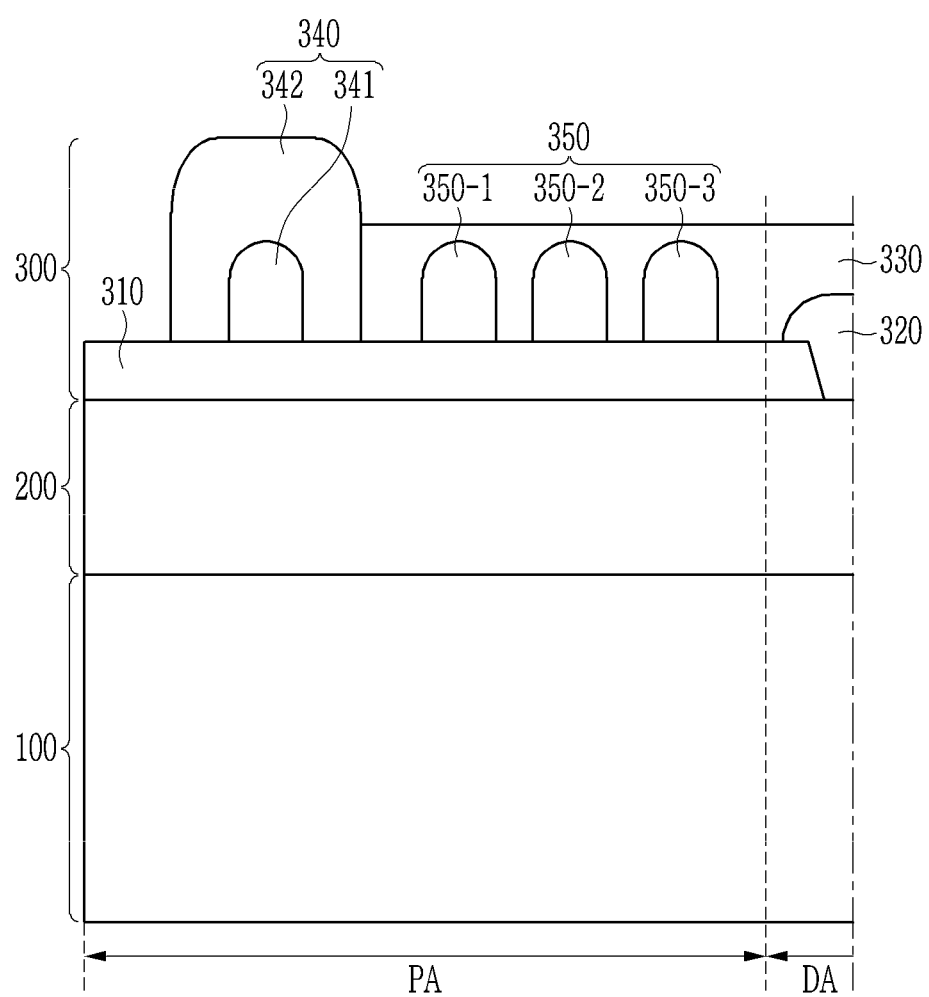
FIG. 18 is a cross-sectional view of portions of a peripheral area and a display area of yet another exemplary embodiment of a display device.

FIG. 18 is a cross-sectional view of portions of a peripheral area and a display area of yet another exemplary embodiment of a display device.

FIG. 18 illustrates a case in which the display device of FIG. 16 further includes the second dam 350 including the plurality of sub-dams 350-1, 350-2, and 350-3. The first sub-dam 350-1, the second sub-dam 350-2, and the third sub-dam 350-3 include one layer. Each of the first sub-dam 350-1, the second sub-dam 350-2, and the third sub-dam 350-3 may be made of the same material as one of the first to third color filters.

Except for these differences, the features of the embodiment described above with reference to FIG. 1 to FIG. 3 may be the same as the embodiment described with reference to FIG. 18, so descriptions of the repeated features of the embodiment described with reference to FIG. 1 to FIG. 3 will be omitted to avoid redundancy.

Figure 19:
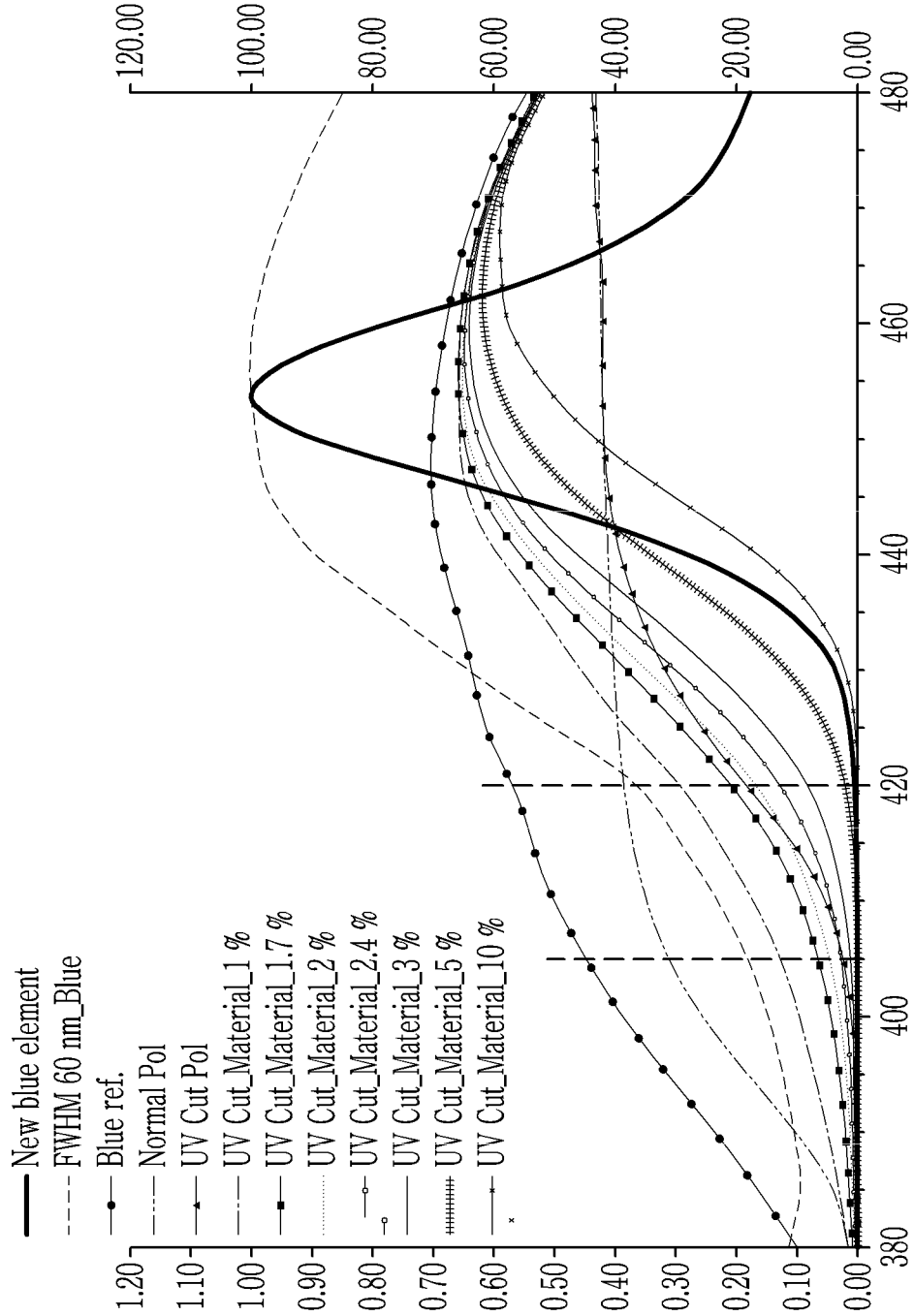
FIG. 19 is an experimental graph of transmittance of light with respect to concentration of an ultraviolet wavelength blocking agent of an overcoating layer.
Figure 20:
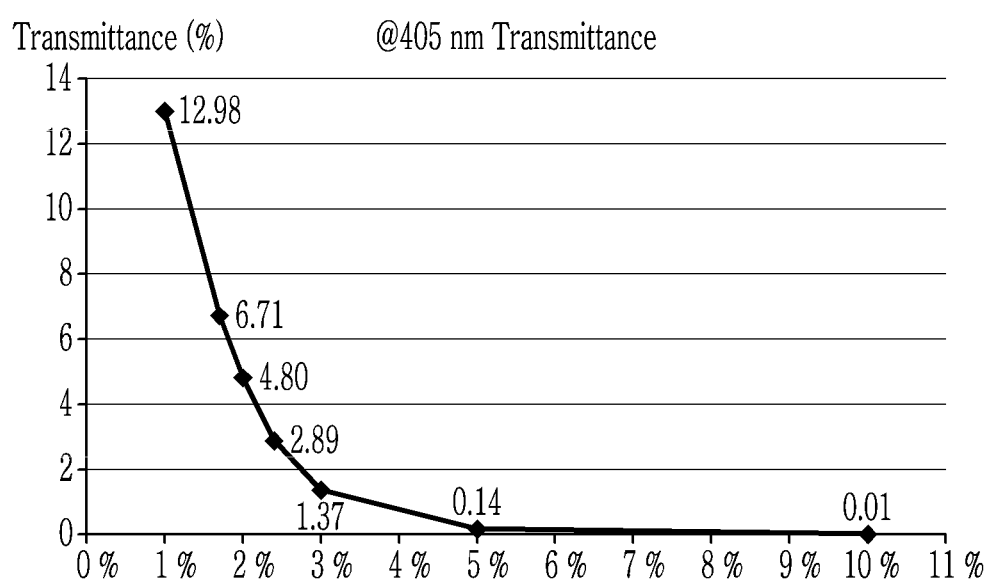
FIG. 20 is a graph of transmittance of ultraviolet rays with respect to concentration of an ultraviolet wavelength blocking agent of an overcoating layer.

FIG. 19 is an experimental graph of transmittance of light with respect to concentration of an ultraviolet wavelength blocking agent of an overcoating layer. FIG. 20 is a graph of transmittance of ultraviolet rays with respect to concentration of an ultraviolet wavelength blocking agent of an overcoating layer.

In FIG. 19, a horizontal axis denotes wavelength of light, and a vertical axis denotes transmittance of light. In FIG. 20, a horizontal axis denotes concentration of the ultraviolet wavelength blocking agent, and a vertical axis denotes transmittance of light (ultraviolet ray) having a short wavelength of 405 nm.

As the concentration of ultraviolet wavelength blocking agent increases, the transmittance of ultraviolet rays in the overcoating layer 330 decreases. For example, when the concentration of the ultraviolet wavelength blocking agent is 1.7%, the transmittance of ultraviolet rays of 405 nm is 6.71%, and when the concentration of the ultraviolet wavelength blocking agent is 2.4%, the transmittance of ultraviolet rays of 405 nm is 2.89%.

However, the transmittance of the blue light emitted from the organic light emitting diode OLED may also decrease when the concentration of the ultraviolet wavelength blocking agent is 5% to 10%. It is appropriate for the concentration of the ultraviolet wavelength blocking agent contained in the overcoating layer 330 to be less than 5%. The concentration of the ultraviolet wavelength blocking agent contained in the overcoating layer 330 may be determined to be approximately 1.7% to 2.4%.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display layer having a display area including a plurality of pixel areas and a peripheral area at least partially surrounding the display area; and
a cover layer disposed on the display layer to encapsulate the display area,
wherein the cover layer includes:
a light blocking portion overlapping the display area and the peripheral area and including a plurality of openings to transmit light from the plurality of pixel areas and to block light in the peripheral area;
a first protrusion disposed on the light blocking portion in the peripheral area and surrounding the display area; and
an overcoating layer covering the display area and contacting a lateral surface of the first protrusion.

2. The display device of claim 1, wherein:
the cover layer further includes a plurality of color filters disposed on the light blocking portion and overlapping the plurality of openings.

3. The display device of claim 2, wherein:
the plurality of color filters include a first color filter of a first color, a second color filter of a second color, and a third color filter of a third color, and
the first color filter, the second color filter, and the third color filter overlap different openings.

4. The display device of claim 3, wherein:
the first protrusion comprises a first dam including a first layer made of the same material as the first color filter.

5. The display device of claim 4, further comprising:
a second dam disposed on the light blocking portion in the peripheral area and disposed between the first dam and the display area to surround the display area,
wherein the second dam includes a second layer including the same material as one of the first to third color filters.

6. The display device of claim 4, wherein:
the first dam further includes a second layer disposed on the first layer, and the second layer includes the same material as the second color filter.

7. The display device of claim 6, wherein:
the second layer has a width substantially equal to or smaller than that of the first layer.

8. The display device of claim 6, further comprising:
a second dam disposed on the light blocking portion in the peripheral area and disposed between the first dam and the display area to surround the display area,
wherein the second dam includes one layer or two layers, in which the one layer includes the same material as one of the first to third color filters, and the two layers include the same materials as two of the first to third colors.

9. The display device of claim 6, wherein:
the first dam further includes a third layer disposed on the second layer, and the third layer includes the same material as the third color filter.

10. The display device of claim 9, wherein:
the third layer has a width substantially equal to or smaller than that of the second layer.

11. The display device of claim 9, further comprising:

a second dam disposed on the light blocking portion in the peripheral area and disposed between the first dam and the display area to surround the display area, wherein the second dam includes one layer, two layers, or three layers, and wherein the one layer includes the same material as one of the first to third color filters, the two layers include the same materials as two of the first to third color filters, and the three layers include the same materials as the first to third color filters.

12. The display device of claim 9, wherein:

the first layer has a thickness substantially the same as that of the first color filter;

the second layer has a thickness substantially the same as that of the second color filter; and the third layer has a thickness substantially the same as that of the third color filter.

13. The display device of claim 1, wherein:

the overcoating layer comprises an ultraviolet wavelength blocking agent.

14. The display device of claim 1, further comprising:

a touch sensor layer disposed between the display layer and the cover layer.

* * * * *